US011152488B2

(12) United States Patent
Lin et al.

(10) Patent No.: US 11,152,488 B2
(45) Date of Patent: Oct. 19, 2021

(54) GATE-ALL-AROUND STRUCTURE WITH DUMMY PATTERN TOP IN CHANNEL REGION AND METHODS OF FORMING THE SAME

(71) Applicant: Taiwan Semiconductor Manufacturing Co., Ltd., Hsinchu (TW)

(72) Inventors: Ta-Chun Lin, Hsinchu (TW); Kuo-Hua Pan, Hsinchu (TW); Jhon Jhy Liaw, Hsinchu County (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/547,026

(22) Filed: Aug. 21, 2019

(65) Prior Publication Data

US 2021/0057544 A1    Feb. 25, 2021

(51) Int. Cl.
| | |
|---|---|
| *H01L 29/66* | (2006.01) |
| *H01L 27/092* | (2006.01) |
| *H01L 29/06* | (2006.01) |
| *H01L 29/423* | (2006.01) |
| *H01L 29/49* | (2006.01) |
| *H01L 21/8238* | (2006.01) |
| *H01L 29/786* | (2006.01) |
| *H01L 21/28* | (2006.01) |

(52) U.S. Cl.
CPC .. *H01L 29/66545* (2013.01); *H01L 21/28088* (2013.01); *H01L 21/823807* (2013.01); *H01L 21/823842* (2013.01); *H01L 27/092* (2013.01); *H01L 29/0673* (2013.01); *H01L 29/42392* (2013.01); *H01L 29/4908* (2013.01); *H01L 29/4966* (2013.01); *H01L 29/66742* (2013.01); *H01L 29/78696* (2013.01)

(58) Field of Classification Search
CPC ........ H01L 29/42392; H01L 29/78696; H01L 29/66545; H01L 21/823807; H01L 21/823088; H01L 21/823842
See application file for complete search history.

(56) References Cited

U.S. PATENT DOCUMENTS

| | | | | |
|---|---|---|---|---|
| 5,965,914 A | * | 10/1999 | Miyamoto | .......... H01L 29/6675 257/331 |
| 7,141,837 B2 | * | 11/2006 | Coronel | ............ H01L 29/42384 257/241 |
| 8,772,109 B2 | | 7/2014 | Colinge | |
| 8,785,285 B2 | | 7/2014 | Tsai et al. | |

(Continued)

*Primary Examiner* — Zandra V Smith
*Assistant Examiner* — John M Parker
(74) *Attorney, Agent, or Firm* — Haynes and Boone, LLP

(57) ABSTRACT

Semiconductor device and the manufacturing method thereof are disclosed herein. An exemplary semiconductor device comprises a nanostructure disposed over a substrate, wherein the nanostructure includes a plurality of semiconductor layers separated vertically from each other and a dummy pattern layer including dielectric material disposed over and separated vertically from a top semiconductor layer of the plurality of semiconductor layers. The exemplary semiconductor device also comprises a gate structure disposed over a channel region, wherein the gate structure wraps around each of the plurality of semiconductor layers and the dummy pattern layer of the nanostructure.

20 Claims, 16 Drawing Sheets

(56) References Cited

U.S. PATENT DOCUMENTS

| | | |
|---|---|---|
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 9,997,519 B1* | 6/2018 | Bao .................... H01L 29/4966 |
| 10,056,454 B2* | 8/2018 | Kim ....................... B82Y 10/00 |
| 2005/0169096 A1* | 8/2005 | Lee ................... H01L 21/32137 365/232 |
| 2018/0090326 A1* | 3/2018 | Jagannathan ......... H01L 29/775 |
| 2020/0105581 A1* | 4/2020 | Chang ................. H01L 27/0886 |
| 2020/0294866 A1* | 9/2020 | Cheng ................ H01L 29/0673 |
| 2020/0373300 A1* | 11/2020 | Zhang .............. H01L 21/02603 |

* cited by examiner

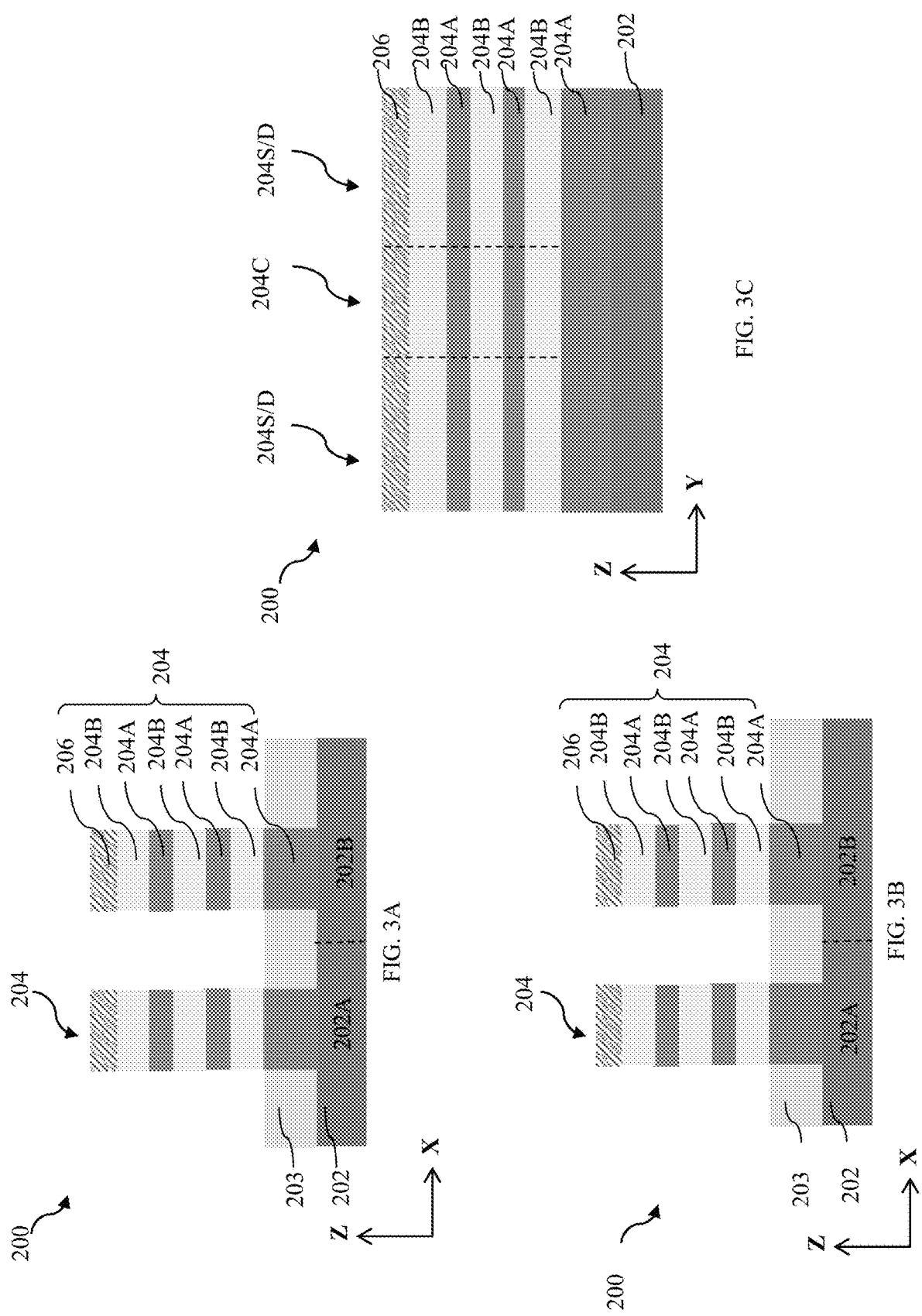

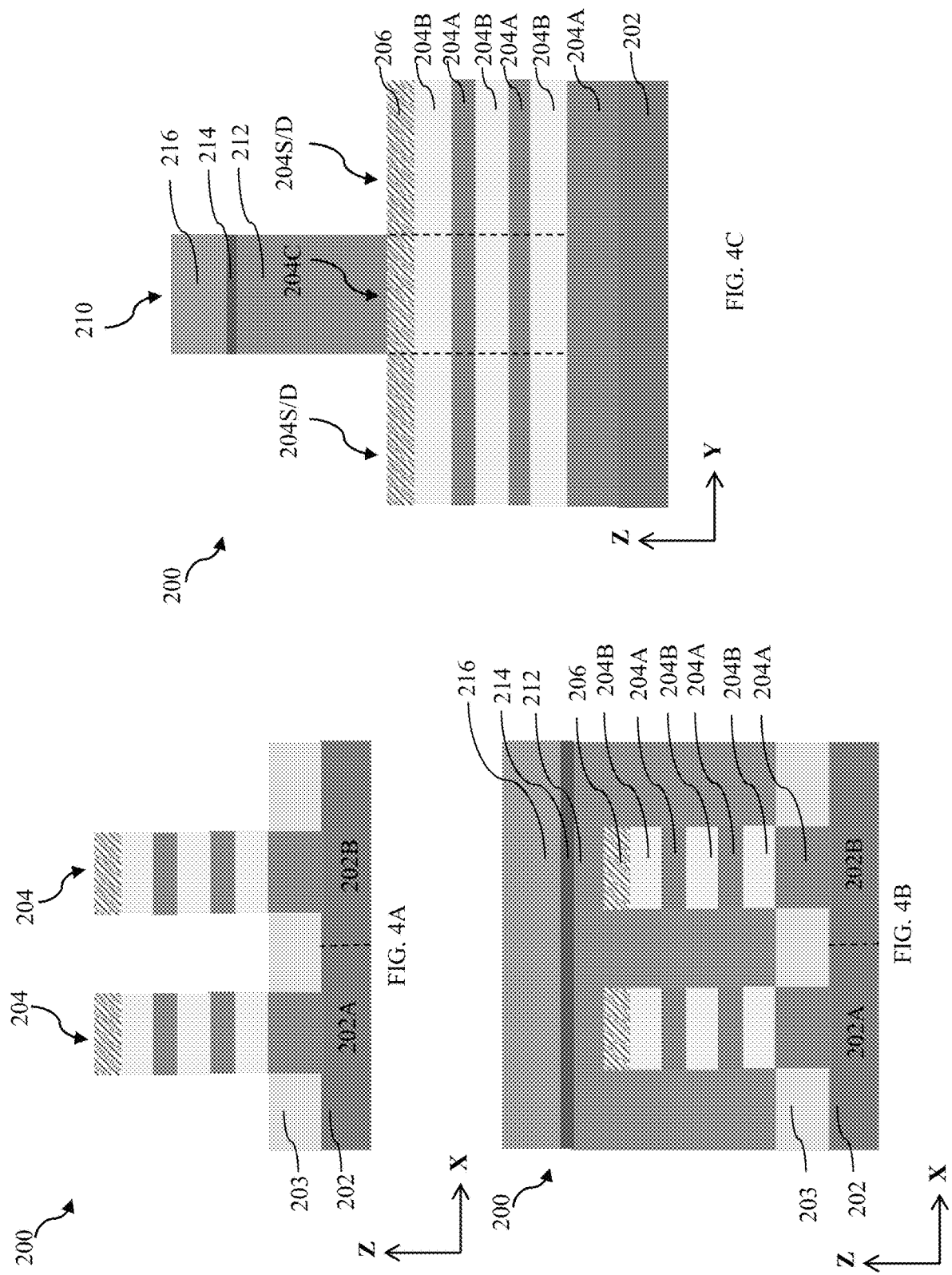

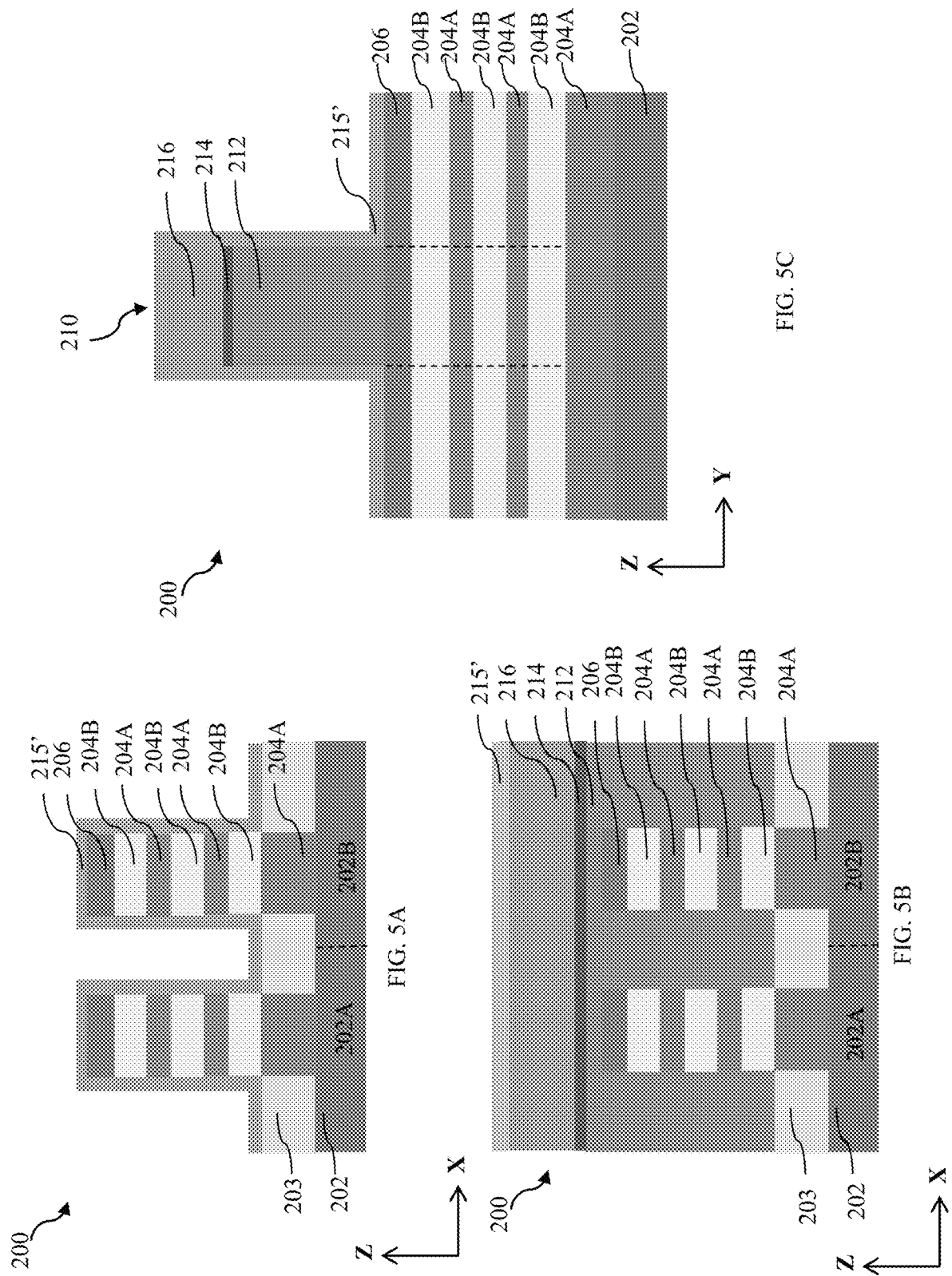

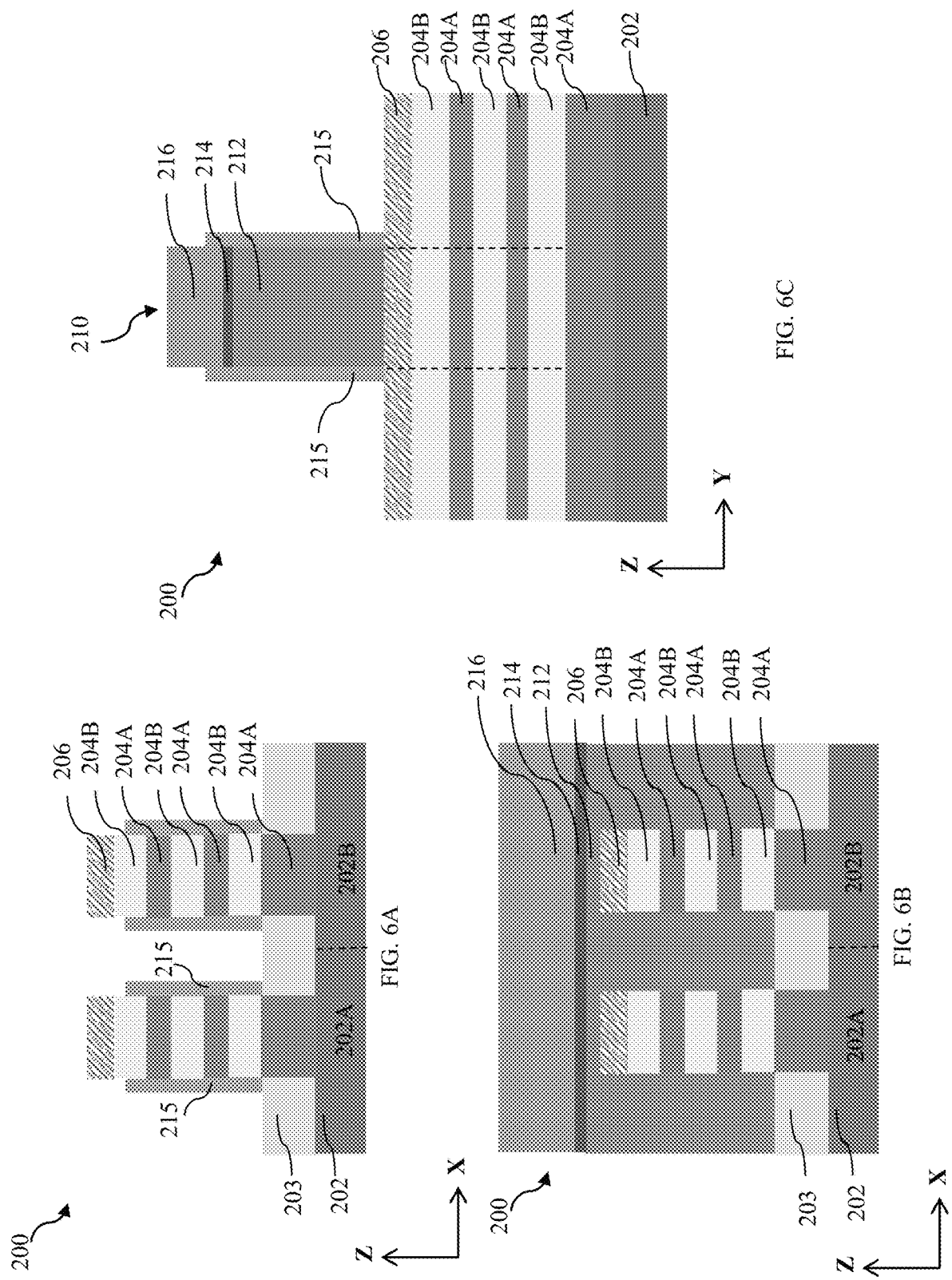

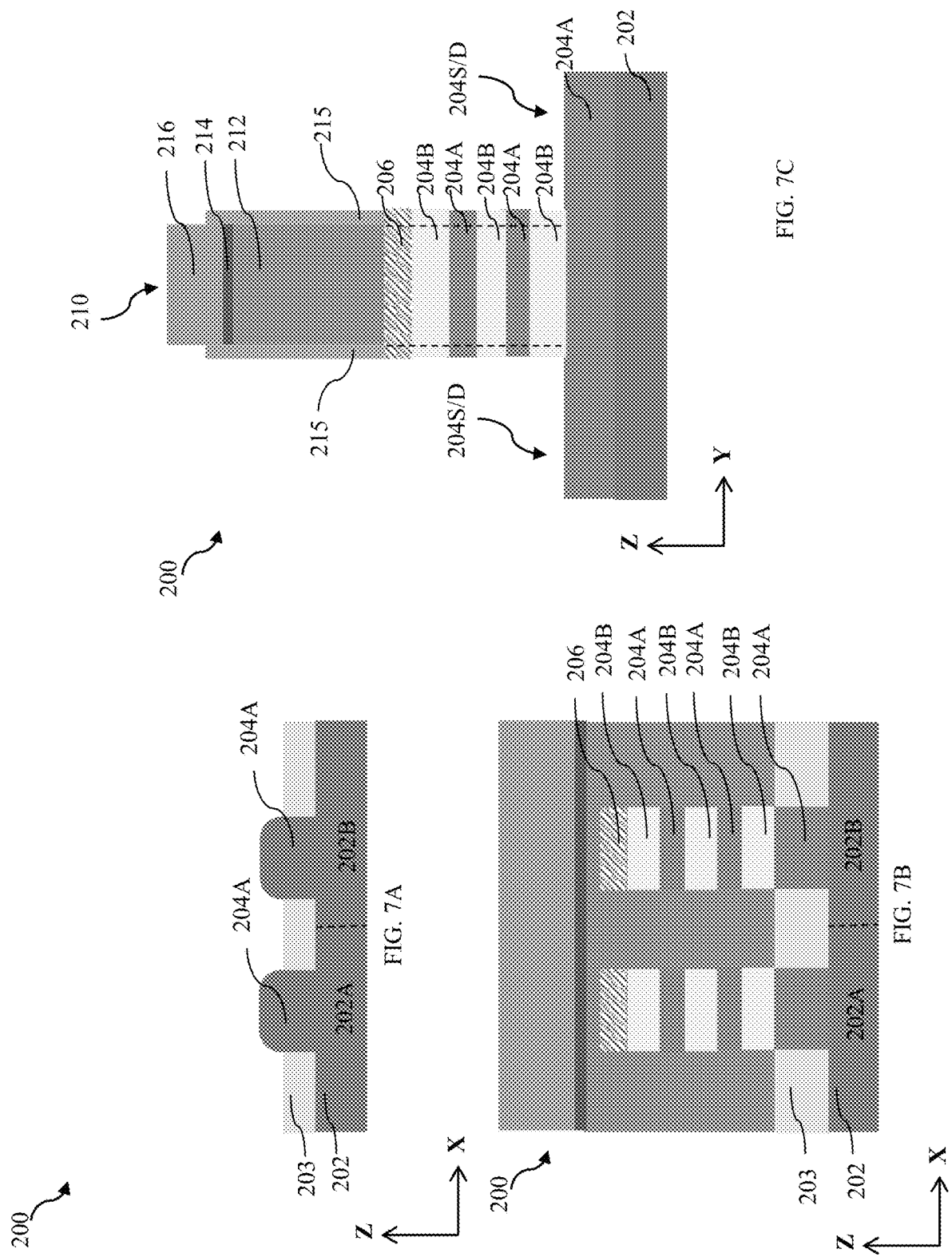

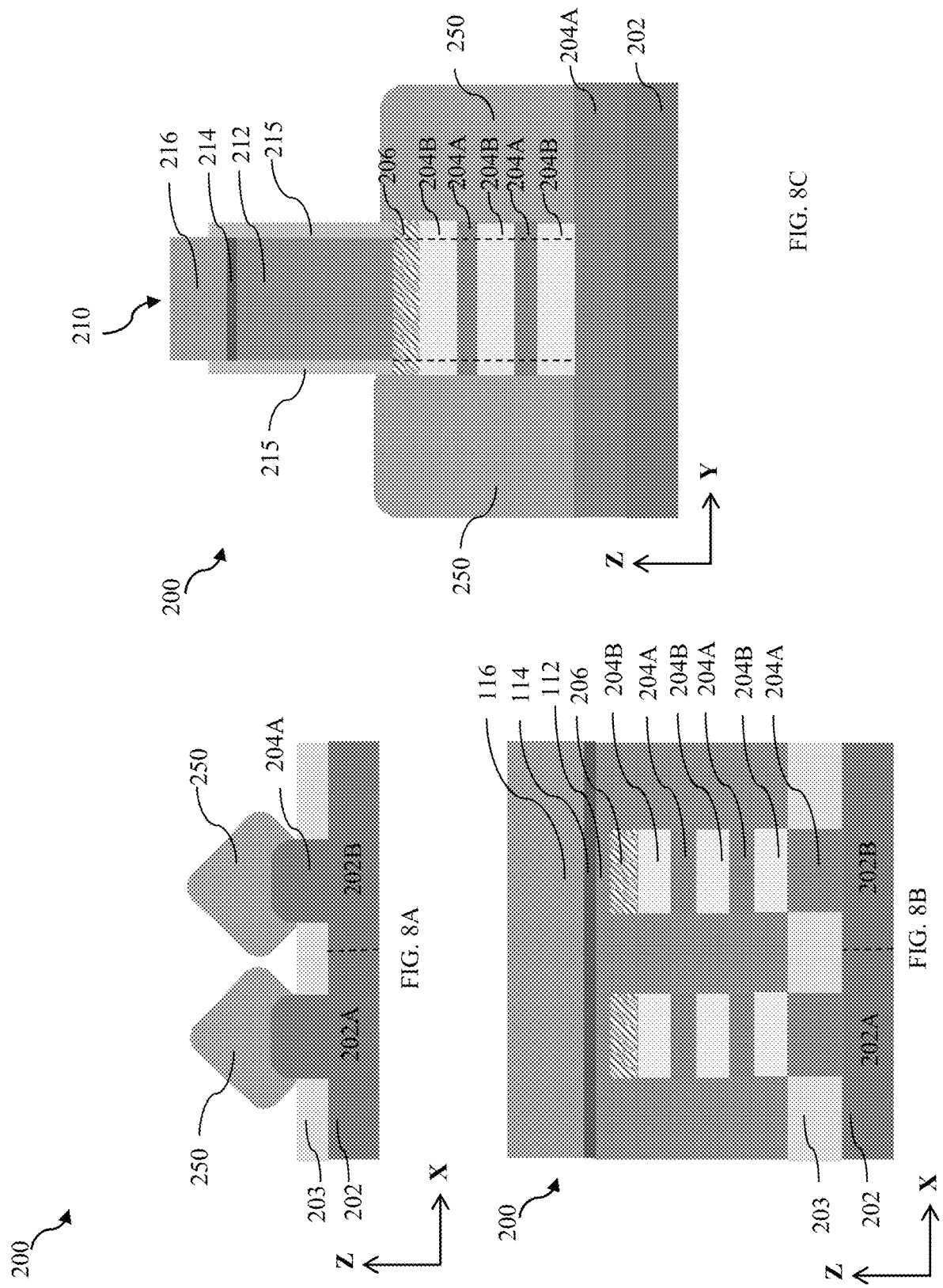

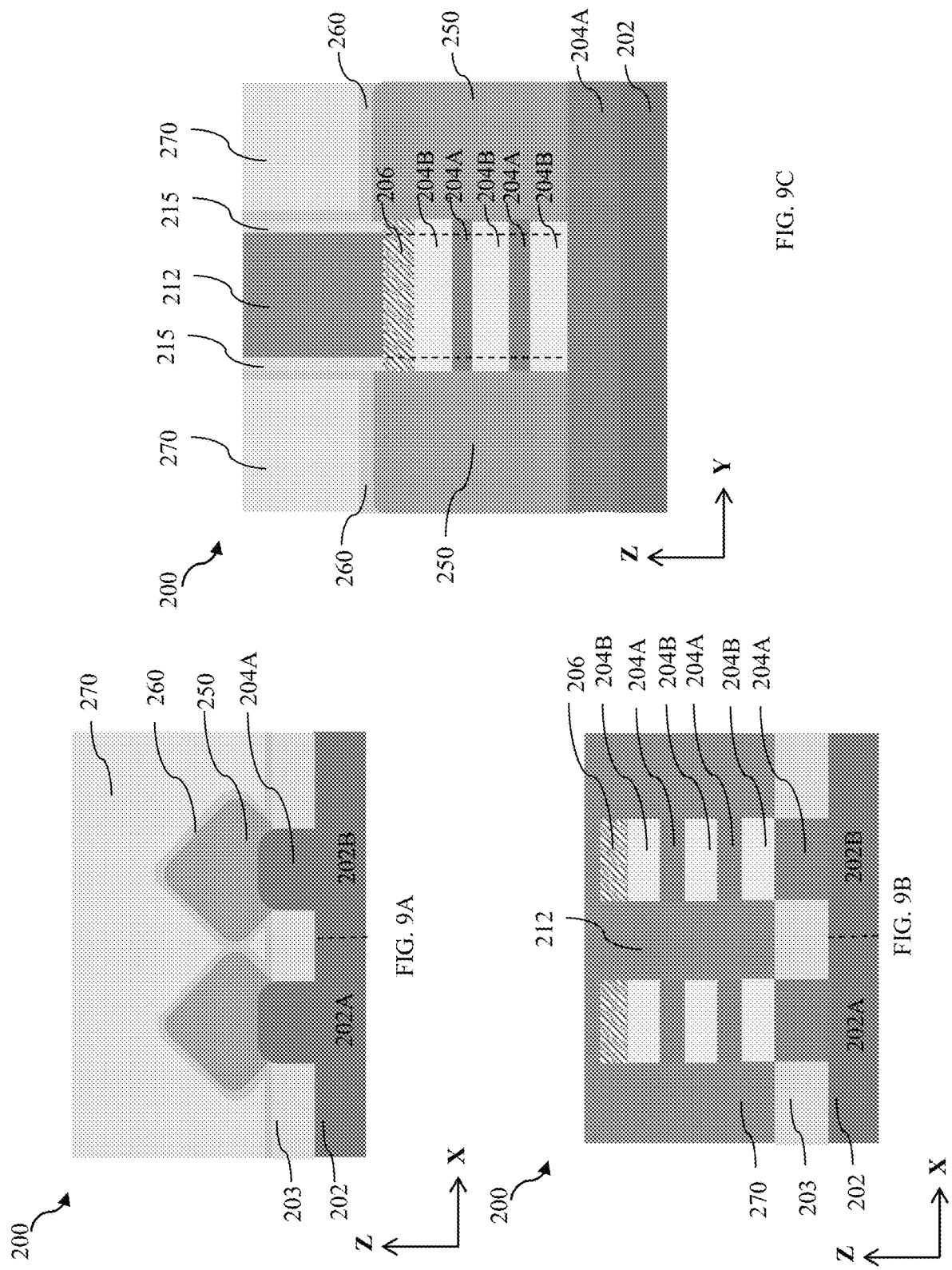

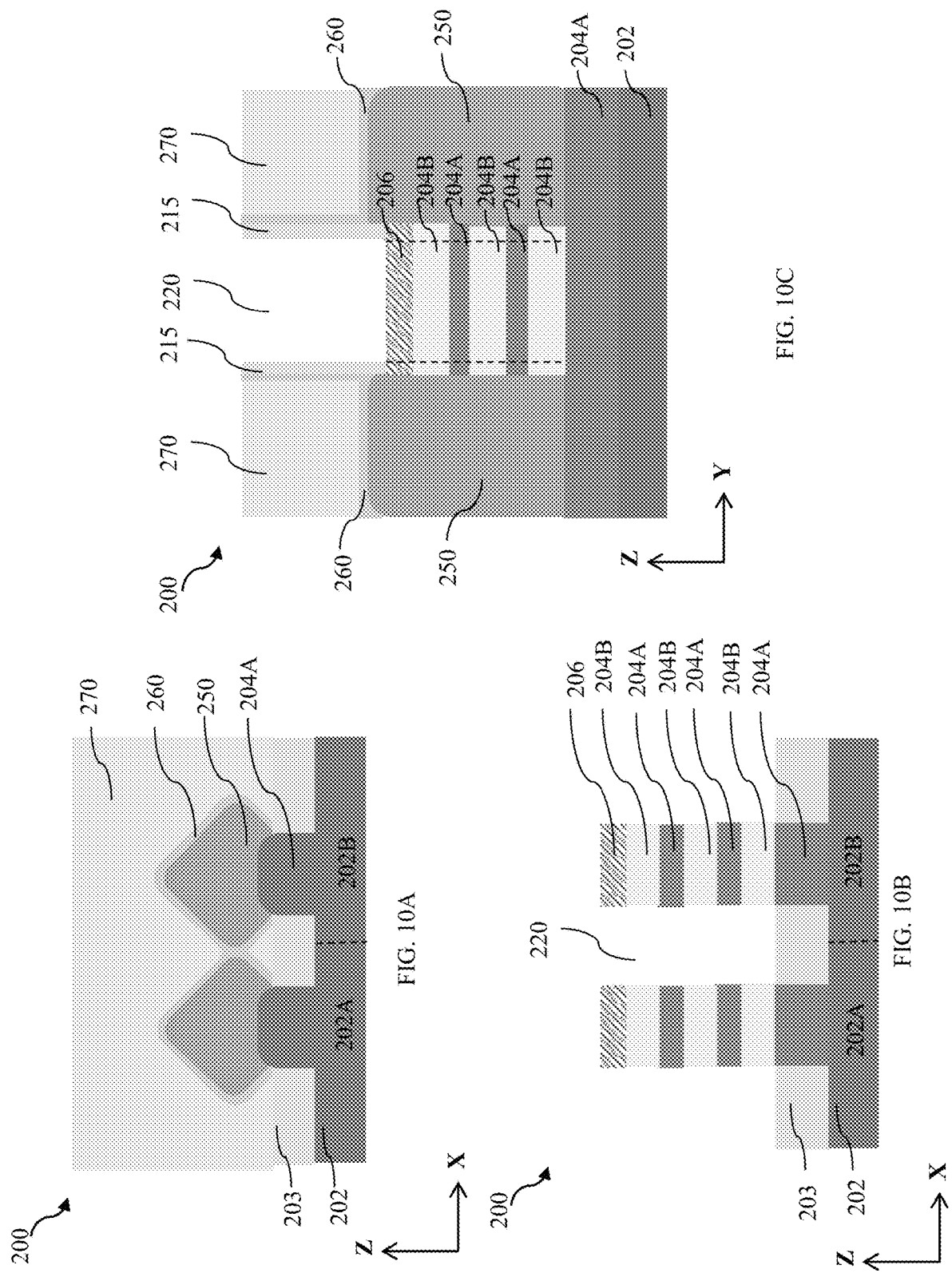

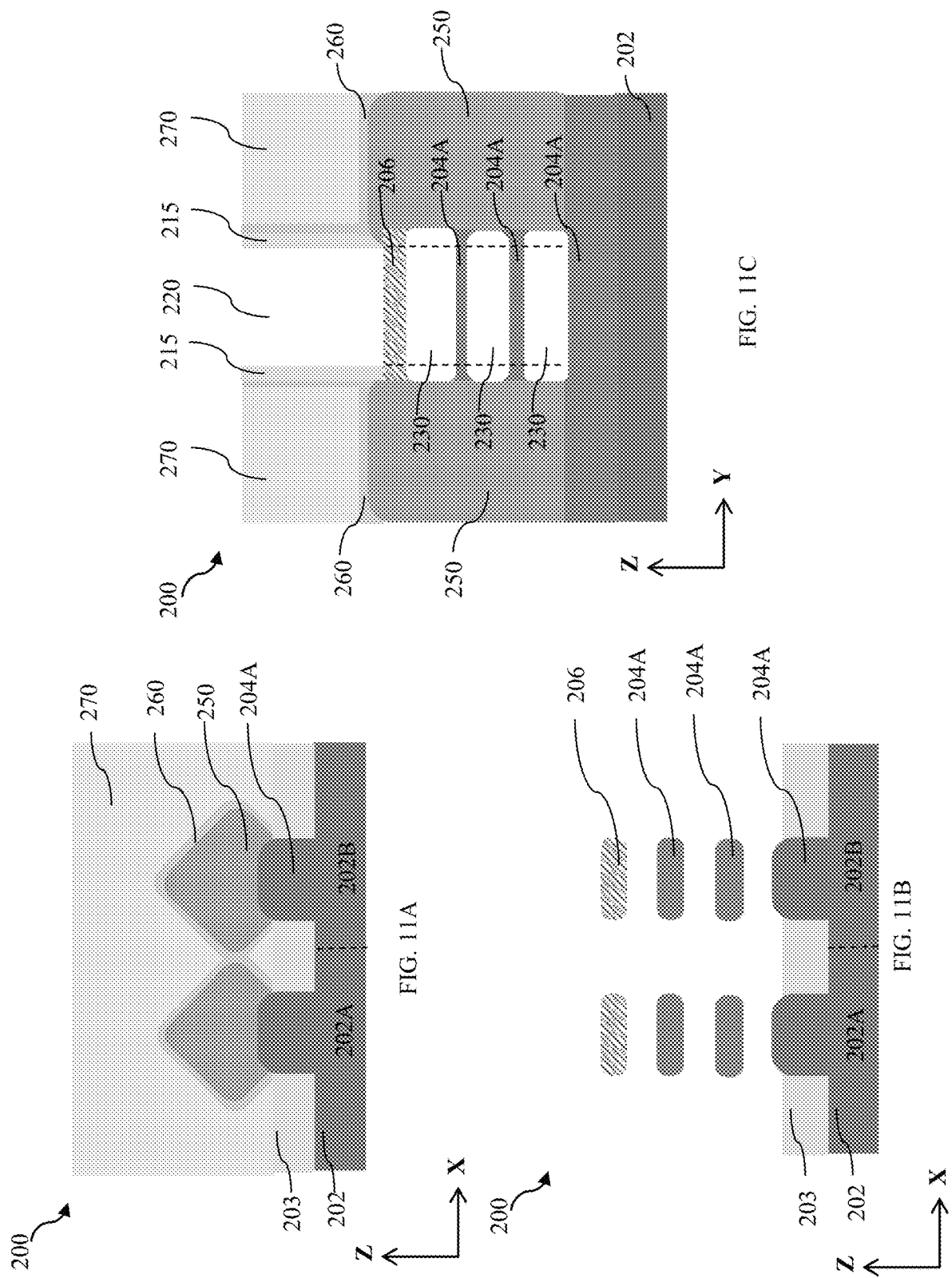

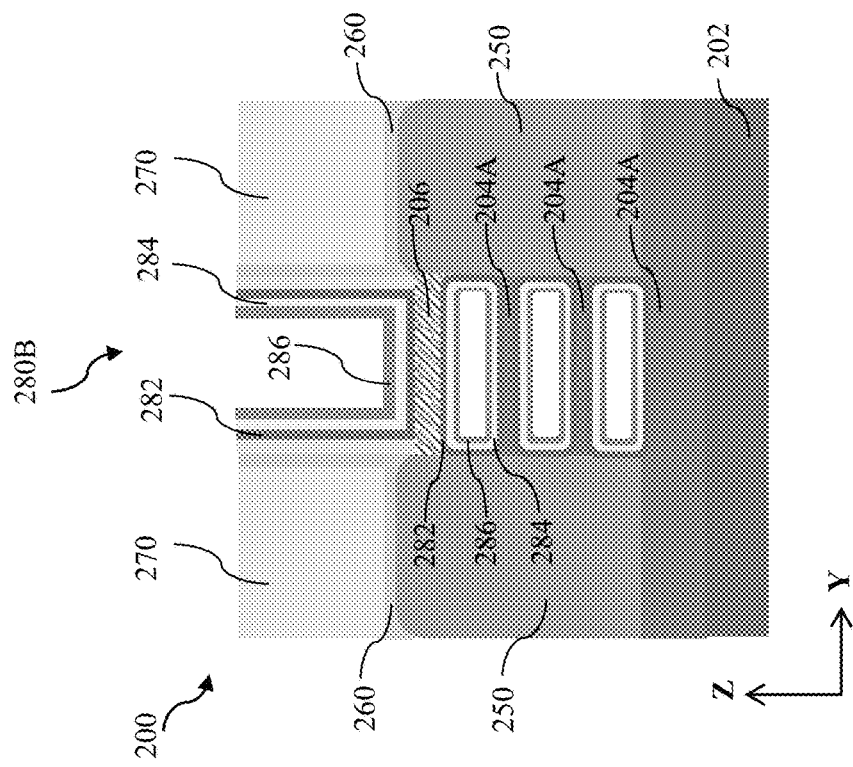
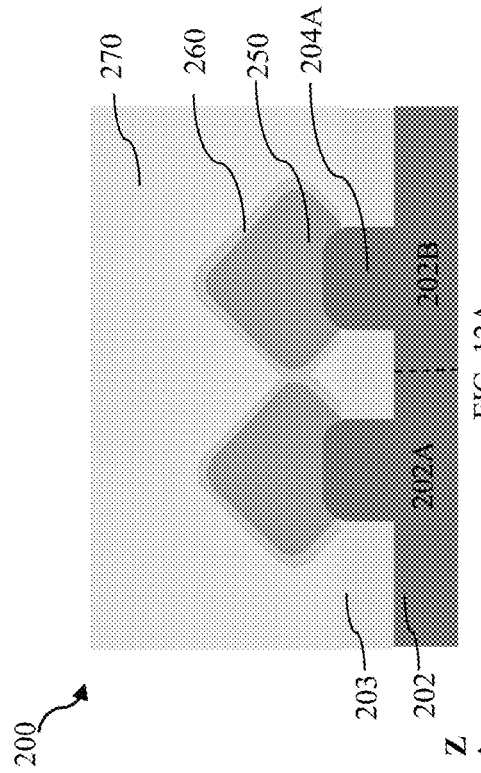
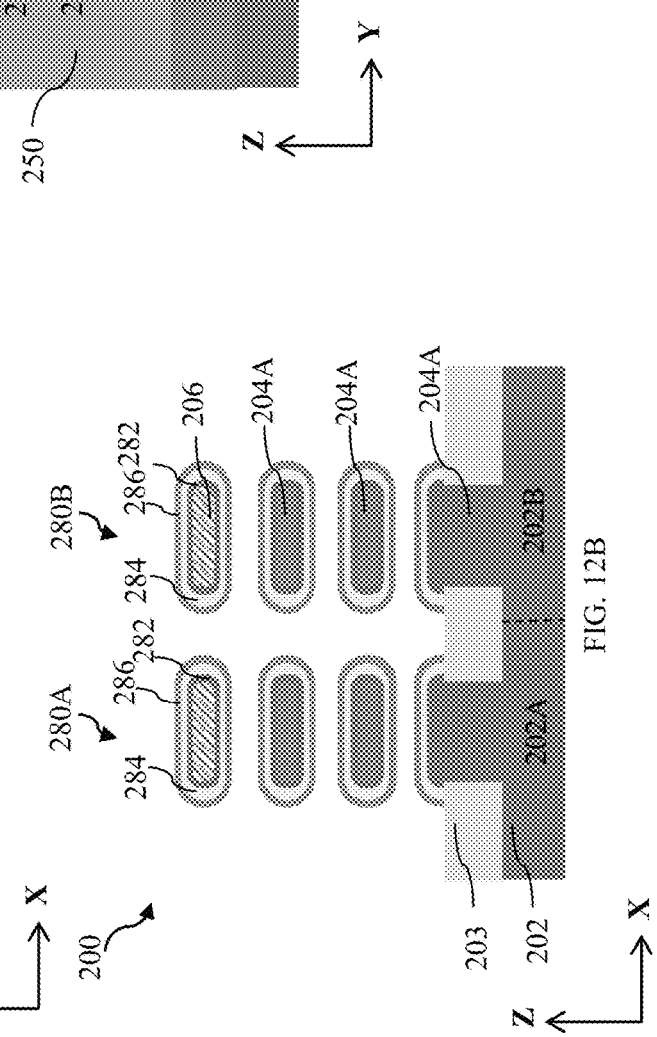
FIG. 12A
FIG. 12B
FIG. 12C

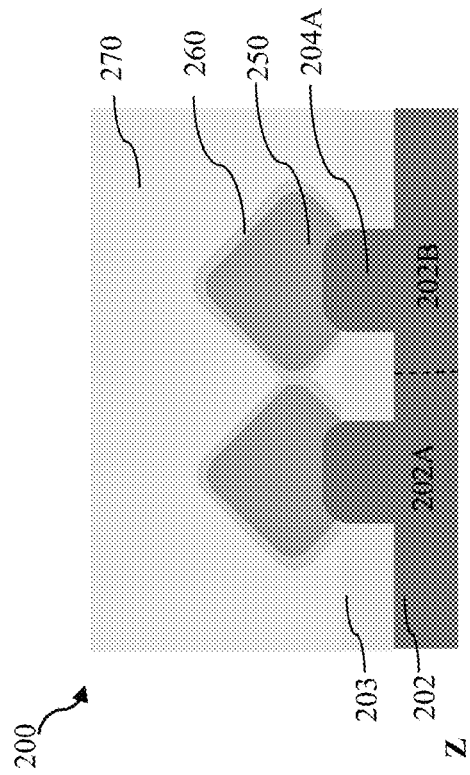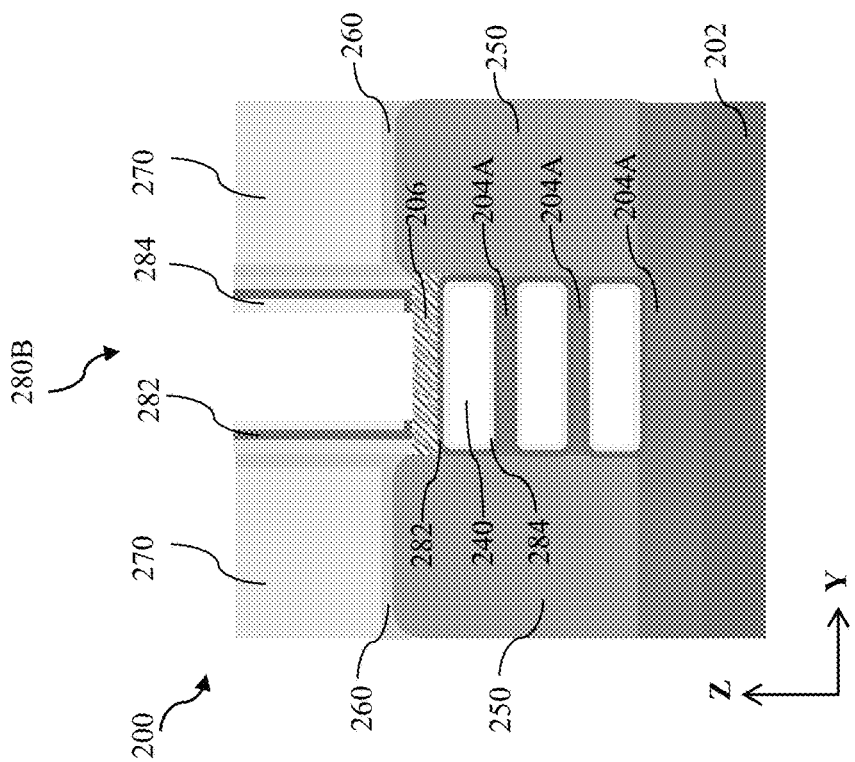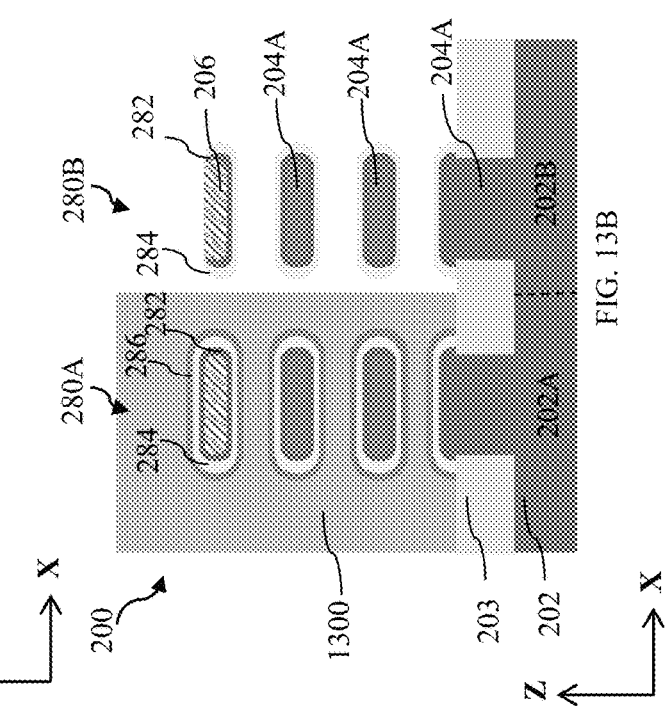

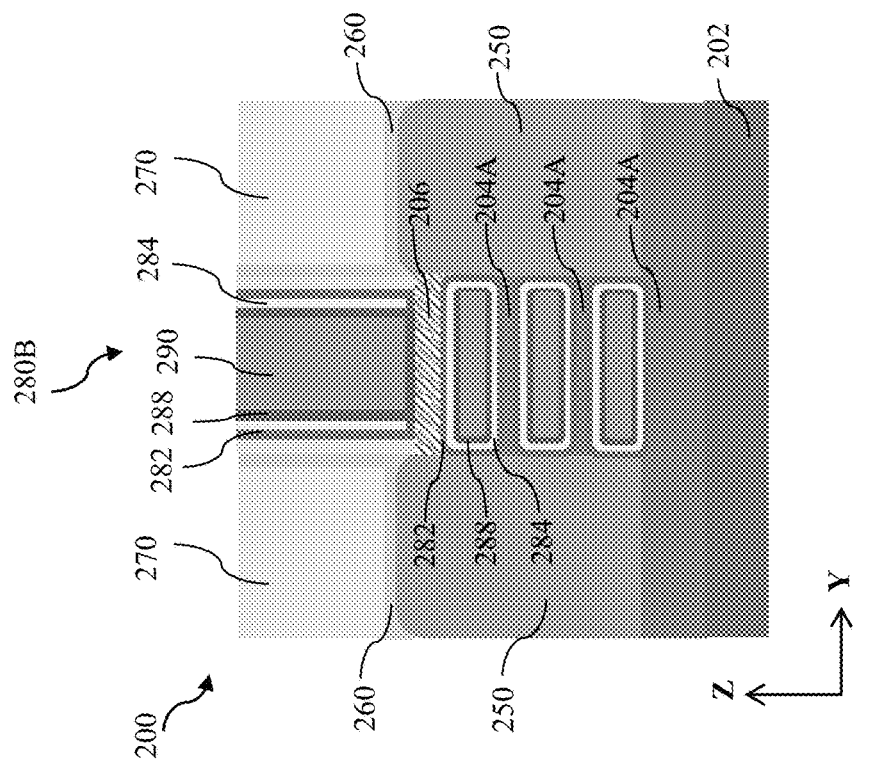
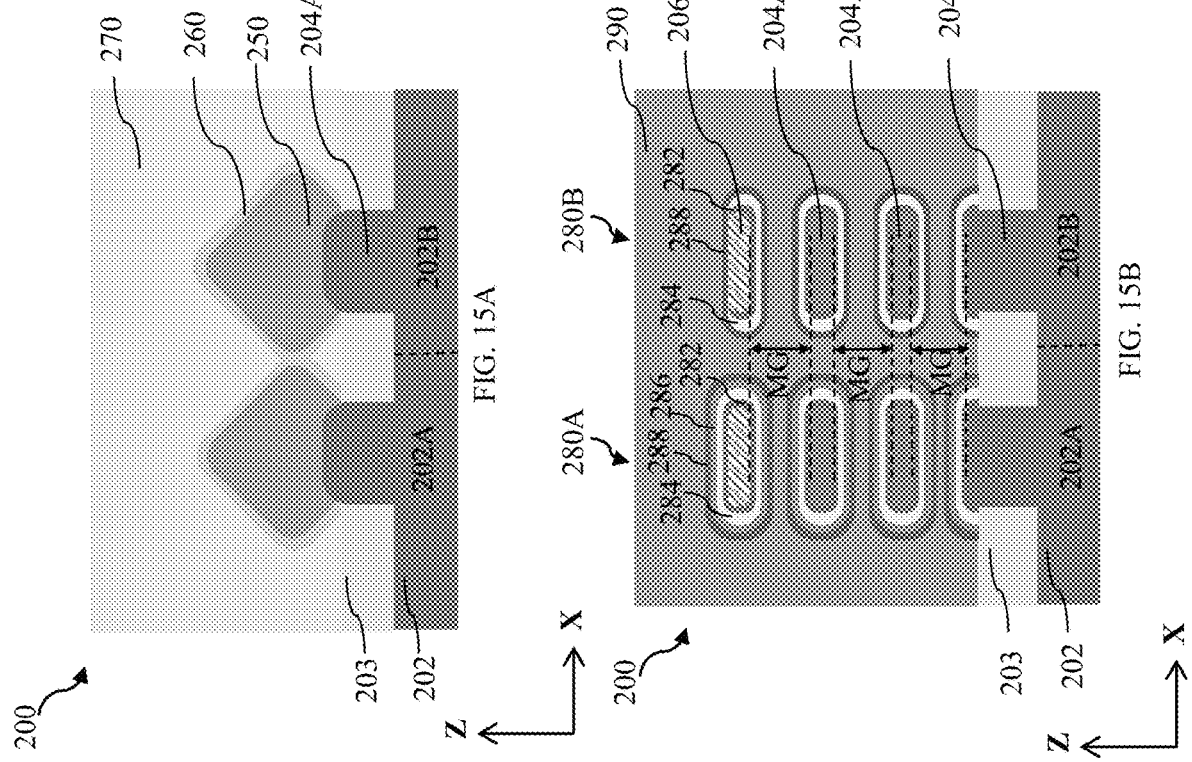

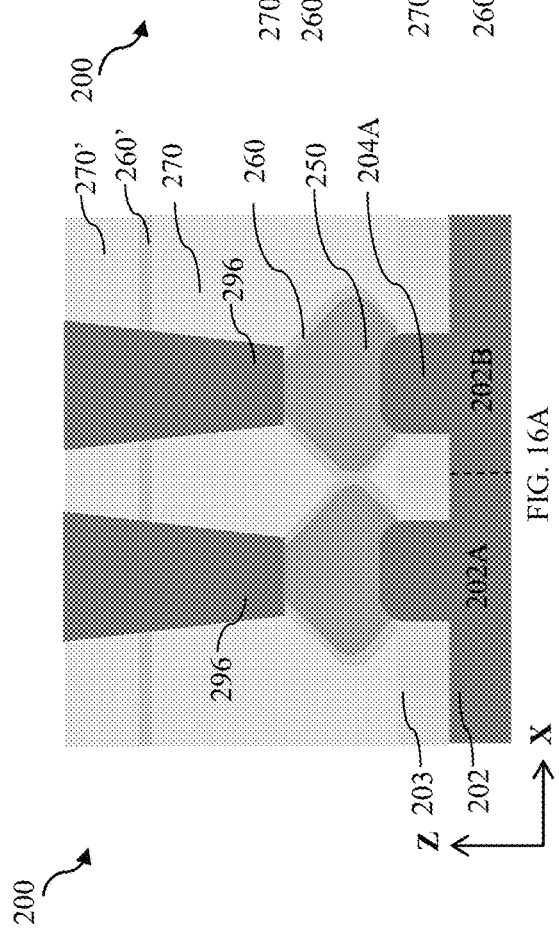
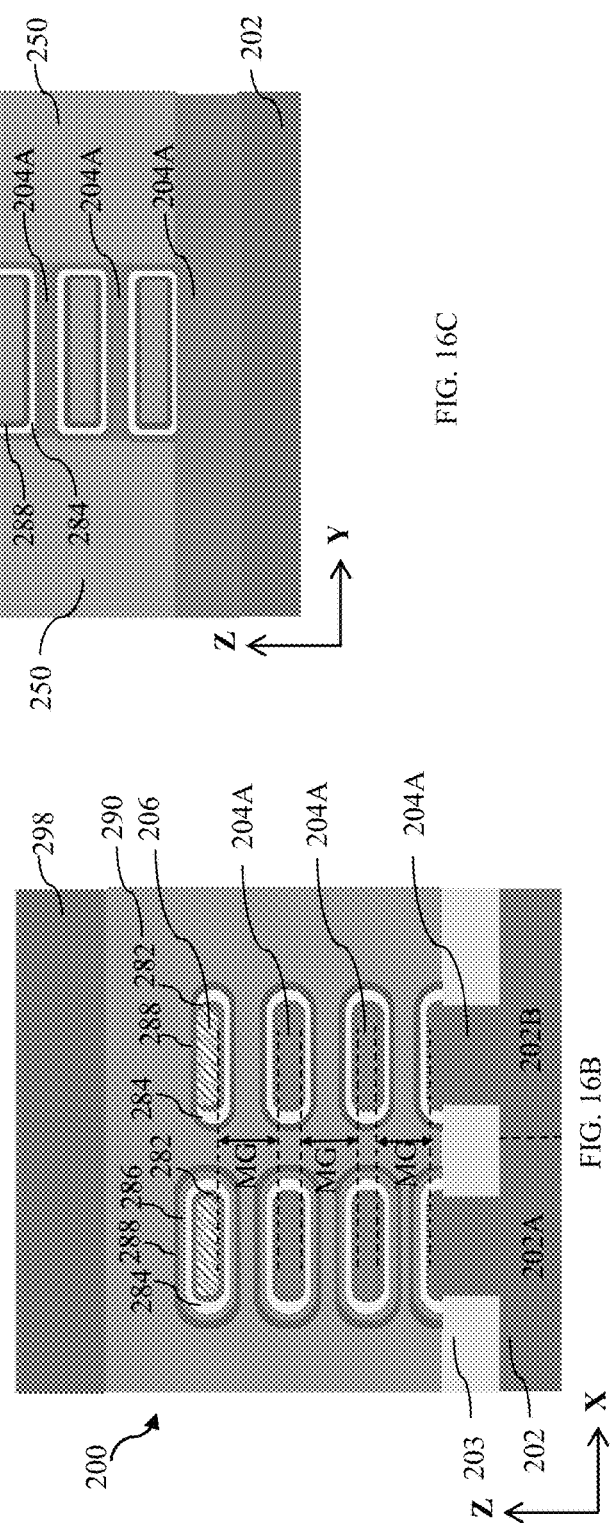
FIG. 16A
FIG. 16B
FIG. 16C

GATE-ALL-AROUND STRUCTURE WITH DUMMY PATTERN TOP IN CHANNEL REGION AND METHODS OF FORMING THE SAME

BACKGROUND

Multi-gate devices have been introduced to improve gate control by increasing gate-channel coupling and reducing off-state current. One such multi-gate device is a gate-all-around (GAA) device. A GAA device generally refers to any device having a gate structure, or portions thereof, formed on more than one side of a channel region (for example, surrounding a portion of the channel region). GAA transistors are compatible with conventional complementary metal-oxide-semiconductor (CMOS) fabrication processes and allow aggressive scaling down of transistors. However, fabrication of GAA devices presents challenges. For example, it has been observed that dummy gate structure formation for a GAA device may cause top channel damage, and work function metal (WFM) filling and patterning may lead to gate dielectric and barrier layer damage. Different layer configurations (including layer materials, thickness, etc.) over the top channel and between the adjacent channels of GAA device may result in non-uniform threshold voltage (Vt) of the GAA device and therefore degrade the performance of the GAA device.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A-16A illustrate cross-sectional views of the semiconductor device of FIG. 2 taken along line A-A at intermediate stages of the method of FIG. 1 in accordance with some embodiments of the present disclosure;

FIGS. 3B-16B illustrate cross-sectional views of the semiconductor device of FIG. 2 taken along line B-B at intermediate stages of the method of FIG. 1 in accordance with some embodiments of the present disclosure; and FIGS. 3C-16C illustrate cross-sectional views of the semiconductor device of FIG. 2 taken along line C-C at intermediate stages of the method of FIG. 1 in accordance with some embodiments of the present disclosure.

DETAILED DESCRIPTION

Figure 1:
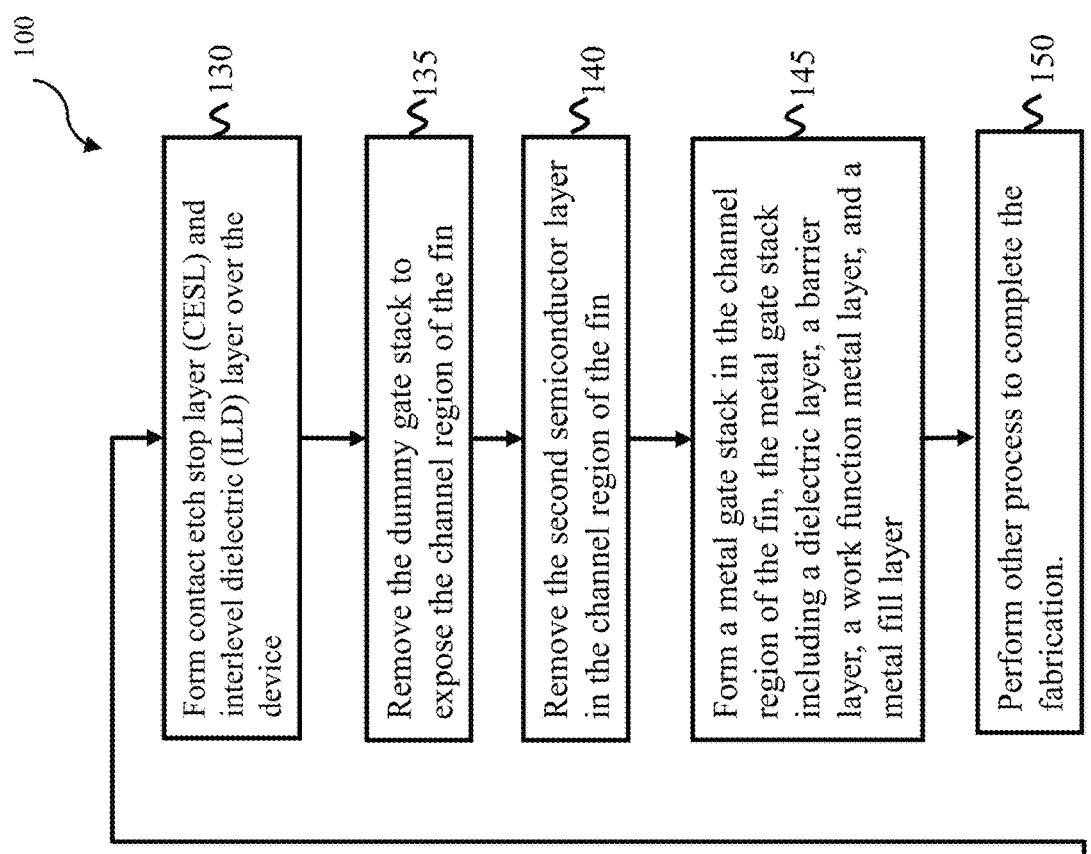
FIG. 1 illustrates a flowchart of an example method for making a semiconductor device in accordance with some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices and the fabrication thereof, and more particularly to methods of fabricating field-effect transistors (FETs), such as gate-all-around FETs (GAA FETs).

In a GAA device, a channel region of a single device may include multiple layers of semiconductor material physically separated from one another. In some examples, a gate of the device is disposed above, alongside, and even between the semiconductor layers of the device. The present disclosure provides a GAA device, wherein the fin of the GAA device comprises a dielectric dummy pattern layer disposed over the top layer of the multiple semiconductor layers. This dielectric dummy pattern layer can protect the top semiconductor layer from being damaged during dummy gate structure formation and/or protect the gate dielectric layer and barrier/work function metal (WFM) layer from being removed during the work function metal patterning. With the protection by the dielectric dummy pattern layer, a uniform layer configuration (including number of the layers, each layer material and each layer thickness) can be achieved between adjacent semiconductor layers and between the top semiconductor layer and the dummy pattern layer, thereby to achieve the uniform threshold voltage (Vt) and improve the performance of the GAA device. In addition, because the dummy pattern layer is deposited over the top semiconductor layer of the fin, it increases the distance between the top channel and the S/D contact, the capacitance between the metal gate and source/drain (S/D) contact can be reduced. These advantages are merely exemplary, and no particular advantage is required for any particular embodiment.

Figure 2:
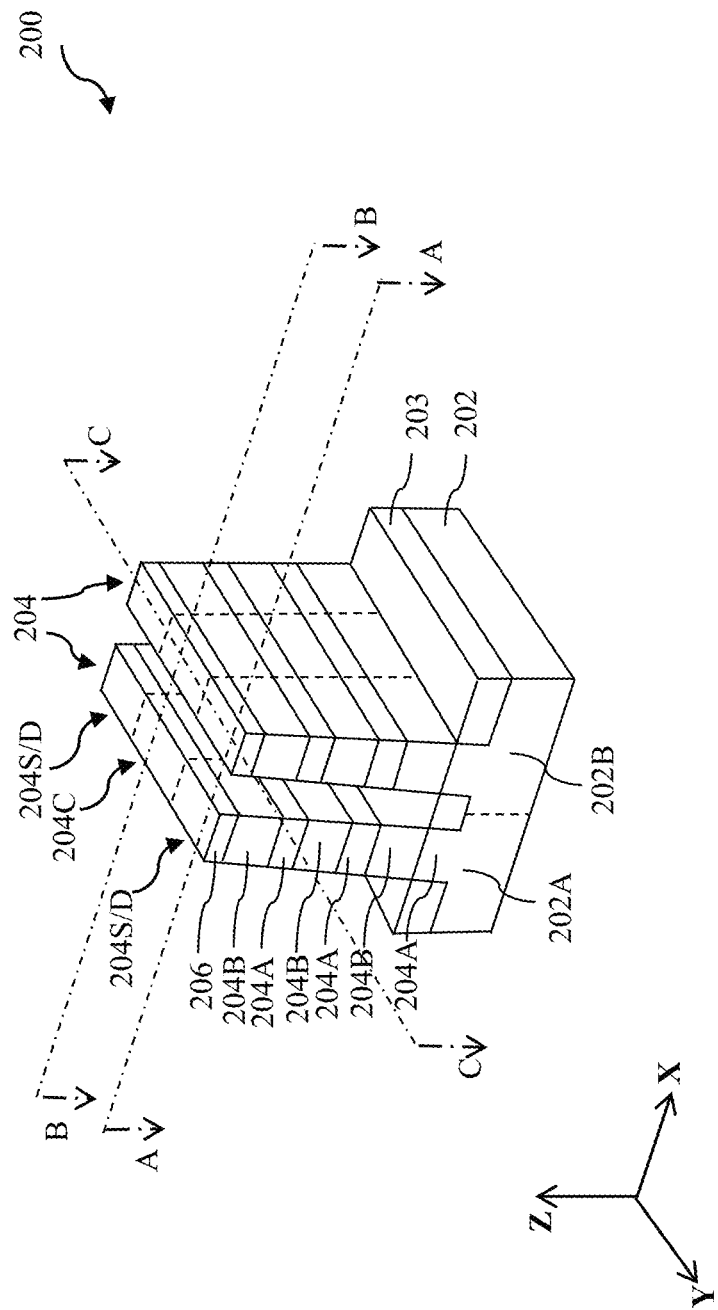
FIG. 2 is a perspective view of a portion of a semiconductor device in an intermediate stage of fabrication according to an embodiment of the method in FIG. 1.

FIG. 1 illustrates a flow chart of a method 100 for forming a semiconductor device 200 (hereinafter called "device 200") in accordance with some embodiments of the present disclosure. Method 100 is merely an example and is not intended to limit the present disclosure beyond what is explicitly recited in the claims. Additional operations can be performed before, during, and after method 100, and some operations described can be replaced, eliminated, or moved around for additional embodiments of the method. Method 100 is described below in conjunction with other figures, which illustrate various three-dimensional and cross-sectional views of device 200, in portion or entirety, during intermediate steps of method 100. In particular, FIG. 2 illustrates a three-dimensional view of device 200; FIGS. 3A-16A are diagrammatic cross-sectional views of device 200 taken along plane A-A in FIG.2 (that is, along an X-direction); FIGS. 3B-16B are diagrammatic cross-sectional views of device 200 taken along plane B-B in FIG.2 (that is, along an X-direction); and FIGS. 3C-16C are diagrammatic cross-sectional views of device 200 taken along plane C-C in FIG.2 (that is, along a Y-direction).

Device 200 may be an intermediate device fabricated during processing of an integrated circuit (IC), or a portion thereof, that may comprise static random-access memory (SRAM) and/or other logic circuits, passive components such as resistors, capacitors, and inductors, and active components such as p-type FETs (PFETs), n-type FETs (NFETs), fin-like FETs (FinFETs), metal-oxide semiconductor field effect transistors (MOSFET), complementary metal-oxide semiconductor (CMOS) transistors, bipolar transistors, high voltage transistors, high frequency transistors, and/or other memory cells. The various transistors may be planar transistors or multi-gate transistors, depending on design requirements of device 200. Device 200 can be a portion of a core region (often referred to as a logic region), a memory region (such as a static random access memory (SRAM) region), an analog region, a peripheral region (often referred to as an input/output (I/O) region), a dummy region, other suitable region, or combinations thereof, of an integrated circuit (IC). In some embodiments, device 200 may be a portion of an IC chip, a system on chip (SoC), or portion thereof. The present disclosure is not limited to any particular number of devices or device regions, or to any particular device configurations. For example, though device 200 as illustrated is a three-dimensional FET device (e.g., a FinFET or a GAA FET), the present disclosure may also provide embodiments for fabricating planar FET devices.

Referring to FIGS. 1, 2, and 3A-3C, at operation 105, a device 200 is provided. Device 200 includes a substrate 202 which is a bulk substrate that includes silicon. Alternatively or additionally, the bulk substrate includes another elementary semiconductor, such as germanium; a compound semiconductor, such as silicon carbide, silicon phosphide, gallium arsenide, gallium phosphide, indium phosphide, indium arsenide, indium antimonide, zinc oxide, zinc selenide, zinc sulfide, zinc telluride, cadmium selenide, cadmium sulfide, and/or cadmium telluride; an alloy semiconductor, such as SiGe, SiPC, GaAsP, AlInAs, AlGaAs, GaInAs, GaInP, and/or GaInAsP; other group III-V materials; other group II-IV materials; or combinations thereof. Alternatively, substrate 202 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Substrate 202 may include various doped regions. In some embodiments, substrate 202 includes n-type doped regions (for example, n-type wells) doped with n-type dopants, such as phosphorus (for example, $^{31}P$), arsenic, other n-type dopant, or combinations thereof. In some embodiments, substrate 202 includes p-type doped region (for example, p-type wells) doped with p-type dopants, such as boron (for example, $^{11}B$, $BF_2$), indium, other p-type dopant, or combinations thereof. In some embodiments, substrate 202 includes doped regions formed with a combination of p-type dopants and n-type dopants. For example, in the depicted embodiment, substrate 202 comprises a p-type doped region 202A doped with p-type dopants and an n-type doped region 202B doped with n-type dopants. The various doped regions can be formed directly on and/or in substrate 202, for example, providing a p-well structure, an n-well structure, a dual-well structure, a raised structure, or combinations thereof. An ion implantation process, a diffusion process, and/or other suitable doping process can be performed to form the various doped regions.

The semiconductor device 200 includes one or more fins 204 (also referred to as nanostructures or active fin regions) protruding from substrate 202. Fins 204 are oriented lengthwise along the y-direction and are arranged side by side along the x-direction. Each fin 204 have a length defined in the x-direction, a width in the y-direction, and a height in the z-direction. The lower portions of fins 204 are separated by an isolation structure 203. Each fin 204 comprises a stack of semiconductor layers 204A and 204B, and a dummy pattern layer 206 deposited on top of the stack of semiconductor layers 204A and 204B. Referring to FIG. 2, device 200 includes two fins 204, and each fin 204 includes three semiconductor layers 204A and three semiconductor layers 204B. In various embodiments, device 200 may include any number of fins 204, and fins 204 may include any number of alternately stacked semiconductor layers 204A and 204B. A number of the total semiconductor layers in fins 204 depends on design of device 200. For example, fins 204 may include two to ten alternating semiconductor layers 204A and 204B. Each of fins 204 has at least one channel region and at least one source region and one drain region defined along their length in the y-direction, where the at least one channel region 204C is disposed between the source region and the drain region (both referred to as source/drain (S/D) regions 204S/D). The "A-A" plane is taken across a set of source/drain regions 204S/D of fins 204, the "B-B" plane is taken across a set of channel regions 204C of fins 204, and the "C-C" plane is taken lengthwise across one of the fins 204.

Each fin 204 is suitable for providing an n-type FET or a p-type FET. In some embodiments, fins 204 as illustrated herein may be suitable for providing FETs of a similar type, i.e., both n-type or both p-type. Alternatively, they may be suitable for providing FETs of opposite types, i.e., an n-type and a p-type. In the depicted embodiment, fin 204 disposed in p-type region 202A provides a p-type FET and fin 204 disposed in n-type region 202B provides a n-type FET.

As discussed above, each of fins 204 includes a semiconductor layer stack having various semiconductor layers disposed over substrate 202. In the depicted embodiments of FIGS. 2 and 3A-3C, the semiconductor layer stack includes alternating semiconductor layers, such as semiconductor layers 204A including a first semiconductor material and semiconductor layers 204B including a second semiconductor material which is different than the first semiconductor material. The different semiconductor materials composed in alternating semiconductor layers 204A and 204B are provided for different oxidation rates and/or different etch selectivity. In some examples, semiconductor layers 204A include silicon (Si), and semiconductor layers 204B include silicon germanium (SiGe). Thus, the semiconductor layer stack is arranged with alternating Si/SiGe/Si/SiGe/ . . . layers from bottom to top. In some embodiments, the bottom semiconductor layer 204A may be merged with substrate 202 (which comprises Si as well) and forms a portion of substrate 202. In some embodiments, the material of the top semiconductor layer in the semiconductor layer stack is the same as the bottom semiconductor layer. In some other embodiments, the material of the top semiconductor layer is different from the bottom semiconductor layer in the semiconductor layer stack. In some embodiments, for a semiconductor layer stack that includes alternating Si and SiGe layers, the bottom semiconductor layer comprises Si, and the top semiconductor layer may be a Si or SiGe layer. In some embodiments, the semiconductor layer stack includes semiconductor layers of the same material but with alternating constituent atomic percentages, such as semiconductor layers 204A having a constituent of a first atomic percent and semiconductor layers 204B having the constituent of a second atomic percent. In some examples, the semiconductor layer stack includes SiGe layers having alternating silicon and/or germanium atomic percentages (for example, $Si_aGe_b/Si_cGe_d/Si_aGe_b/Si_cGe_d$... from bottom to top, where a and c are different atomic percentages of silicon and b and d are different atomic percentages of germanium). In various embodiments, the alternating material layers in the semiconductor layer stack may include other materials such as germanium, a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, or combinations thereof. The materials of the alternating semiconductor layers may be chosen based on providing differing oxidation rates and/or etch selectivity. In some embodiments, semiconductor layers 204A may be undoped or substantially dopant-free (i.e., having an extrinsic dopant concentration from about 0 cm$^{-3}$ to about 1×10$^{17}$ cm$^{-3}$). In some examples, no intentional doping is performed when forming semiconductor layers 204A. In some other embodiments, semiconductor layers 204A may be doped with a p-type dopant such as boron or boron compound (B, $^{11}$B or $BF_2$), aluminum (Al), indium (In), gallium (Ga), or combinations thereof for a p-type channel, or an n-type dopant such as phosphorus (P, $^{31}$P), arsenic (As), antimony (Sb), or combinations thereof for an n-type channel. In some embodiments, semiconductor layers 204A may include different compositions among them, and semiconductor layers 204B may include different compositions among them.

As discussed above, each fin 204 also comprises a dummy pattern layer 206 disposed over the top layer of the semiconductor layer stack (the alternating semiconductor layers 204A or 204B). In the depicted embodiment, dummy pattern layer 206 is disposed over the top semiconductor layer 204B including SiGe. In some other embodiments, if the top layer of the alternating semiconductor layer is 204A including Si, dummy pattern layer 206 is disposed over the top semiconductor layer 204A. A bottom surface of dummy pattern layer 206 directly contacts a top surface of the top layer of the semiconductor layer stack and conformally mapping the top surface of the top layer of the semiconductor layer stack. Dummy pattern layer 206 includes a dielectric material having different etching selectivity than the top layer of the semiconductor layer stack, thus dummy pattern layer 206 can protect the top layer of the semiconductor layer stack (204A or 204B) from being damaged during the following fabrication processes, such as dummy gate structure formation and/or work function metal patterning. In some embodiments, dummy pattern layer 206 includes a dielectric material including oxygen, carbon, nitrogen, other suitable material, or combinations thereof. For example, dummy pattern layer 206 may include silicon nitride (SiN), silicon carbon nitride (SiCN), silicon oxy carbide (SiOC), silicon oxy carbon nitride (SiOCN), hafnium oxide (HfO), lanthanoids oxide (LaO), aluminum oxide (AlO), other suitable dielectric materials, or combinations thereof.

In some embodiments, different semiconductor layers (204A, 204B, and 206) of fins 204 have the same thickness in the Z-direction. In some other embodiments, different semiconductor layers (204A, 204B, and 206) of fins 204 have different thickness. In some embodiments, the bottom layer 204A of the semiconductor layer stack (which is partially buried in isolation structure 203) is thicker than other layers of the semiconductor layer stack. In some embodiments, each semiconductor layer 204A and 204B that extends above isolation structure 203 has a thickness ranging from about 3 nanometers (nm) to about 30 nm. In some embodiments, dummy pattern layer 206 has a thickness ranging from about 1 nm to about 30 nm, which is about 30% to 100% of the semiconductor layers 204A and/or 204B that extends above isolation structure 203. For example, a thickness of dummy pattern layer 206 is about 30% to about 100% of the thickness of the top semiconductor layer 204A. In some embodiments, a height of fins 204 over the isolation structure 203 in the z-direction is about 50 nm to about 80 nm. Thus, a ratio of the thickness of dummy pattern layer 206 to a height of fin 204 is about 5-25%. However, the present disclosure is not limited to such configuration.

Fins 204 are formed over substrate 202 by any suitable process. In some embodiments, a combination of deposition, epitaxy, photolithography, etching, and/or other suitable processes are performed to form fins 204 including alternating semiconductor layers 204A and 204B and dummy pattern layer 206. For example, first, various semiconductor layers 204A and 204B comprising different semiconductor materials (for example, layer 204A comprises Si and layer 204B comprises SiGe) are alternatively deposited over substrate 202. In some embodiments, the semiconductor layers 204A and 204B may be grown by a molecular beam epitaxy (MBE) process, a CVD process such as a metal organic CVD (MOCVD) process, and/or other suitable epitaxial growth processes. Subsequently, dummy pattern layer 206 is deposited over the alternating semiconductor layers 204A and 204B. Dummy pattern layer 206 may be formed by atomic layer deposition (ALD), CVD, plasma enhanced CVD (PECVD), physical vapor deposition (PVD), other suitable methods, or combinations thereof. A masking element is then formed over the layers 204A, 204B, and 206 through a photolithography process. The photolithography process may include forming a photoresist (or resist) over the layers 204A, 204B, and 206, exposing the resist to a pattern that defines various geometrical shapes, performing post-exposure bake processes, and developing the resist to form the masking element. Thereafter, the layers 204A, 204B, and 206 are etched through the masking element to form trenches therein. The etching processes may include one or more dry etching processes, wet etching processes, and other suitable etching techniques. For example, a dry etching process may implement an oxygen-containing gas, a fluorine-containing gas (e.g., CF4, SF6, CH2F2, CHF3, and/or C2F6), a chlorine-containing gas (e.g., Cl2, CHCl3, CCl4, and/or BCl3), a bromine-containing gas (e.g., HBr and/or CHBR3), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid (HNO3), and/or acetic acid (CH3COOH); or other suitable wet etchant(s). The remaining portions of the layers become fins 204.

In some other embodiments, fins 204 may be formed in various steps. For example, first, semiconductor stacks including the first semiconductor layers 204A and the second semiconductor layers 204B (not including dummy pattern layer 206) are formed by the fabrication steps including position, epitaxy, photolithography, etching process as discussed above. Thereafter, dummy pattern layer 206 is deposited (for example, by ALD) over the top layer of the semiconductor stack, thereby to form fins 204 including dummy pattern layer 206 and the first and second semiconductor layers 204A and 204B.

An isolation structure(s) 203 is formed over and/or in substrate 202 to isolates active device regions and/or passive device regions of device 200, such as the various GAA transistors of device 200. Isolation structure 203 further separates and isolates fins 204 from one another. Isolation structure 203 can be configured as different structures, such as a shallow trench isolation (STI) structure, a deep trench isolation (DTI) structure, a local oxidation of silicon (LO-COS) structure, or combinations thereof. Isolation structure 203 includes an isolation material, such as silicon oxide (SiO), silicon nitride (SiN), silicon oxynitride (SiON), other suitable isolation material (for example, including silicon, oxygen, nitrogen, carbon, and/or other suitable isolation constituent), or combinations thereof. In some embodiments, STI features can be formed by etching a trench in substrate (for example, by using a dry etch process and/or wet etch process) and filling the trench with insulator material (for example, by using a chemical vapor deposition (CVD) process or a spin-on glass process). A chemical mechanical polishing (CMP) process may be performed to remove excessive insulator material and/or planarize a top surface of isolation structure 203. In some embodiments, STI features can be formed by depositing an insulator material over substrate 202 after forming fins 204 (in some implementations, such that the insulator material layer fills gaps (trenches) between fins 204) and etching back the insulator material layer to form isolation structure 203. In some implementations, isolation structure 203 includes a multilayer structure that fills trenches, such as a bulk dielectric layer disposed over a liner dielectric layer, where the bulk dielectric layer and the liner dielectric layer include materials depending on design requirements (for example, a bulk dielectric layer that includes silicon nitride disposed over a liner dielectric layer that includes thermal oxide). In some implementations, isolation structure 203 includes a dielectric layer disposed over a doped liner layer (including, for example, boron silicate glass (BSG) or phosphosilicate glass (PSG)).

Now turning to FIGS. 1 and 4A-4C, at operation 110, a dummy gate stack 210 is formed over fins 204. Dummy gate stack 210 serves as a placeholder for subsequently forming a metal gate structure. As will be discussed in detail below, dummy gate stack 210 is replaced with a metal gate structure during a gate replacement process after other components (for example, epitaxial S/D features 250) of device 200 are fabricated. Dummy gate stack 210 extends along the X-direction and traverse respective fins 204. In the depicted embodiment, dummy gate stack 210 is disposed over channel regions 204C of fins 204, thereby interposing respective S/D regions 204S/D of fins 204. Dummy gate stack 210 engages the respective channel regions 204C of fins 204, such that current can flow between the respective S/D regions 204S/D of fins 204 during operation. In the depicted embodiment of FIGS. 4A-4C, dummy gate stack 210 includes a dummy gate electrode 212 comprising polysilicon and various other layers, for example, a dielectric etch stop layer 214 disposed over dummy gate electrode 212, and/or a hard mask layer 216 disposed over dielectric etch stop layer 214. Dummy gate stack 210 may also include an interfacial layer (not shown, for example, comprising silicon oxide) disposed over fins 204 and substrate 202, and below dummy gate electrode 212. Dielectric etch stop layer 214 may include silicon oxide, silicon nitride, silicon oxynitride, or other dielectric materials. Hard mask layer 216 may include one or more layers of material such as silicon oxide (SiO), silicon nitride (SiN), and/or silicon carbonitride (SiCN). Dummy gate electrode 212 can be single dielectric layer of multiple layers. A material of dummy gate electrode 212 can be selected from silicon oxide (SiO), silicon oxycarbide (SiOC), silicon oxynitride (SiON), silicon oxycarbonitride (SiOCN), carbon content oxide, nitrogen content oxide, carbon and nitrogen content oxide, metal oxide dielectric, hafnium oxide (HfO2), tantalum oxide (Ta2O5), titanium oxide (TiO2), zirconium oxide (ZrO2), aluminum oxide (Al2O3), yttrium oxide (Y2O3), any other suitable material, or combinations thereof.

Dummy gate stack 210 is formed by deposition processes, lithography processes, etching processes, other suitable processes, or combinations thereof. For example, a deposition process may be performed to form a dummy gate electrode layer 212, a dielectric etch stop layer 214, and a hard mask layer 216 over substrate 202, fins 204, and isolation structure 203. The deposition process includes CVD, PVD, ALD, HDPCVD, MOCVD, RPCVD, PECVD, LPCVD, ALCVD, APCVD, plating, other suitable methods, or combinations thereof. A lithography patterning and etching process is then performed to pattern dummy gate electrode layer 212, dielectric etch stop layer 214, and hard mask layer 216 to form dummy gate stack 210, such that dummy gate stack 210 wraps fins 204. The lithography patterning processes include resist coating (for example, spin-on coating), soft baking, mask aligning, exposure, post-exposure baking, developing the resist, rinsing, drying (for example, hard baking), other suitable processes, or combinations thereof. Alternatively, the lithography exposing process is assisted, implemented, or replaced by other methods, such as maskless lithography, electron-beam writing, or ion-beam writing. In yet another alternative, the lithography patterning process implements nanoimprint technology. The etching processes include dry etching processes, wet etching processes, other etching methods, or combinations thereof.

Referring to FIGS. 1, 5A-5C and 6A-6C, at operation 115, gate spacers 215 are formed along sidewalls of dummy gate stack 210. Formation of gate spacers includes various steps. For example, as illustrated in FIGS. 5A-5C, a spacer layer 215' is disposed conformally over semiconductor device 200, including fins 204, dummy gate stack 210, and isolation structure 203. In various embodiments, spacer layer 215' may include a single layer or a multilayer structure. In some embodiments, spacer layer 215' may include one or more dielectric materials such as silicon nitride (SiN), silicon oxide (SiO), silicon carbide (SiC), silicon oxycarbide (SiOC), silicon carbonitride (SiCN), silicon oxycarbonitride (SiOCN), other suitable materials, or combinations thereof. In the present embodiment, spacer layer 215' has a thickness of few nanometers. Spacer layer 215' may be formed by chemical oxidation, thermal oxidation, ALD, CVD, PVE, other suitable methods, or combinations thereof.

Turning to FIGS. 6A-6C, still at operation 115, spacer layer 215' is etched by an anisotropic etching process to remove portions of spacer layer 215' from a top surface of the dummy gate stack 210 in the channel region 204C and from a top surface of fins 204 in the S/D regions 204S/D.

Portions of spacer layer 215' along the sidewalls of dummy gate stack 210 substantially remain and become gate spacers 215. In some embodiments, the anisotropic etching process is a dry (e.g., plasma) etching process. In some embodiments, the dry etching process may use an etchant including a bromine-containing gas (e.g., HBr and/or $CHBR_3$), a fluorine-containing gas (e.g., $CF_4$, $SF_6$, $CH_2F_2$, $CHF_3$, and/or $C_2F_6$), other suitable gases, or combinations thereof.

Now referring to FIGS. 1 and 7A-7C, at operation 120, portions of fins 204 in the S/D regions 204S/D are removed along gate spacers 215. Therefore, sidewalls of alternating semiconductor layers 204A and 204B and dummy pattern layer 206 are exposed in the S/D regions (FIG. 7C). In some embodiments, portions of fins 204 in the S/D regions 204S/D are removed by a suitable etching process, such as a dry etching process, a wet etching process, a reactive ion etching (RIE) process, or combinations thereof. As illustrated in FIG. 7C, portions of fins 204 (including the dummy patter layer 206 and the semiconductor layers 204A and 204B) under gate spacers 215 remain and are substantially unchanged. In some embodiments, portions of fins 204 are selectively removed along gate spacers 215 without etching or substantially etching portions of dummy gate stack 210. In some embodiments, portion of isolation structure 203 in the S/D region 204S/D may also be selectively etched (i.e. FIG. 7A), so that a top portion of the bottom layer of semiconductor layer 204A may be exposed. This is called a fin recess process. The fin recess process may include dry etching, wet etching, other etching process, or combinations thereof.

Now referring to FIGS. 1 and 8A-8C, at operation 125, S/D features 250 are epitaxially grown in the S/D regions of fins 204. In some other embodiments, epitaxial S/D features 250 are grown from and wrap at least a portion of fin active regions. In some embodiments, as shown in the depicted embodiment, epitaxial S/D features 250 are separated from one another. In some other embodiments, epitaxial source/drain features 250 extend (grow) laterally along the x-direction (in some embodiments, substantially perpendicular to the length of fins 204), such that epitaxial S/D features 250 are merged epitaxial S/D features that span more than one fin. In some other embodiments, epitaxial S/D features 250 include partially merged portions (with interruption (or gaps) between epitaxial material grown from adjacent fins 204) and/or fully merged portions (without interruption (or gaps) between epitaxial material grown from adjacent fins 204). In some embodiments, epitaxial S/D features 250 include the same material as semiconductor layers 204A (for example, both include silicon). In some other embodiments, epitaxial S/D features 250 and semiconductor layers 204A include different materials or compositions. In various embodiments, epitaxial S/D features 250 may include a semiconductor material such as silicon or germanium; a compound semiconductor such as silicon germanium, silicon carbide, gallium arsenide, gallium phosphide, indium phosphide, indium arsenide, indium antimonide; an alloy semiconductor such GaAsP, AlInAs, AlGaAs, InGaAs, GaInP, and/or GaInAsP; or combinations thereof. An epitaxy process may be implement to epitaxially grow S/D features 250. The epitaxy process may include CVD deposition (for example, vapor-phase epitaxy (VPE), ultra-high vacuum CVD (UHV-CVD), LPCVD, and/or PECVD), molecular beam epitaxy, other suitable SEG processes, or combinations thereof. The epitaxy process can use gaseous and/or liquid precursors.

In some embodiments, epitaxial S/D features 250 may be doped with n-type dopants and/or p-type dopants. In some embodiments, epitaxial S/D features 250 are doped with boron (for example, $^{11}B$, $BF_2$), indium, carbon, other p-type dopant, or combinations thereof (for example, forming an Si:Ge:B epitaxial S/D feature or an Si:Ge:C epitaxial S/D feature). In some embodiments, epitaxial S/D features 250 are doped with phosphorus (P, $^{31}P$), arsenic (As), other n-type dopant, or combinations thereof (for example, forming an Si:P epitaxial S/D feature, an Si:C epitaxial S/D feature, or an Si:C:P epitaxial S/D feature). In some embodiments, epitaxial S/D features 250 may include multiple epitaxial semiconductor layers, and different epitaxial semiconductor layers are different in amount of dopant included therein. In some embodiments, epitaxial S/D features 250 include materials and/or dopants that achieve desired tensile stress and/or compressive stress in the channel regions. In some embodiments, epitaxial S/D features 250 are doped during deposition by adding impurities to a source material of the epitaxy process. In some embodiments, epitaxial S/D features 250 are doped by an ion implantation process subsequent to a deposition process. In some embodiments, annealing processes are performed to activate dopants in epitaxial S/D features 250 of semiconductor device 200, such as HDD regions and/or LDD regions.

Referring to FIGS. 1 and 9A-9C, at operation 130, a contact etch stop layer (CESL) 260 and an interlevel dielectric (ILD) layer 270 are deposited over substrate 202. Particularly, CESL 260 and ILD layer 270 are disposed over epitaxial source/drain features 250, dummy gate stack 210, spacers 215, and/or isolation structure 203. In some embodiments, ILD layer 270 is a portion of a multilayer interconnect (MLI) feature that electrically couples various devices (for example, transistors, resistors, capacitors, and/or inductors) and/or components (for example, gate structures and/or source/drain features) of device 200, such that the various devices and/or components can operate as specified by design of device 200. ILD layer 270 includes a dielectric material including, for example, silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, Calif.), Xerogel, Aerogel, amorphous fluorinated carbon, Parylene, BCB, SILK (Dow Chemical, Midland, Mich.), polyimide, other low-k dielectric material, or combinations thereof. In some embodiments, ILD layer 270 has a multilayer structure having multiple dielectric materials. In some embodiments, CESL 260 is disposed between ILD layer 270 and epitaxial source/drain features 250, isolation structure 203, dummy gate stack 210, and/or spacers 215. CESL 260 includes a material different than ILD layer 270, such as a dielectric material that is different than the dielectric material of ILD layer 270. In the depicted embodiment, where ILD layer 270 includes a low-k dielectric material, CESL 260 includes silicon and nitrogen (for example, silicon nitride or silicon oxynitride). CESL 260 and/or ILD layer 270 are formed over substrate 202, for example, by a deposition process (such as CVD, FCVD, PVD, ALD, HDPCVD, MOCVD, RPCVD, PECVD, LPCVD, ALCVD, APCVD, plating, other suitable methods, or combinations thereof). Subsequent to the deposition of CESL 260 and/or ILD 270, a CMP process is performed to planarize a top surface of device 200, which also removes hard mask layer 216 and dielectric etch stop layer 214 (FIGS. 9B and 9C). As a result, dummy gate electrode 212 is exposed from a top surface of device 200.

Now referring to FIGS. 1 and 10A-10C, at operation 135, dummy gate electrode 212 is removed to form a trench 220.

The channel regions 204C of fins 204 are exposed in trench 220. As shown in FIG. 10B, sidewalls of fins 204 including semiconductor layers 204A, 204B and dummy pattern layer 206 are exposed in trench 220. In some embodiments, removing dummy gate electrode 212 includes one or more etching processes, such as wet etching, dry etching, RIE, other etching techniques, or combinations thereof. Removing dummy gate electrode 212 may also result in removing a top portion of the dummy pattern layer 206 resulting in damage to the dummy pattern layer 206 due to reducing an overall thickness of the dummy pattern layer 206, also known as thinning. This effect may be unintentional and may result from insufficient etching selectivity between the dummy gate electrode 212 and underlying layers. However, thinning the dummy pattern layer 206 is not detrimental to the fabrication process described herein as it would be in a conventional fabrication process. In the conventional fabrication process, semiconductor fins do not comprise dummy pattern layer 206. Therefore, the top semiconductor layer (for example, semiconductor layer 204A comprises Si) of the semiconductor fin may be damaged (made thinner) during the etching process to remove the dummy gate. As a result, the top channel semiconductor layer (for example, 204A) of the semiconductor device is thinner than other channel semiconductor layers of the semiconductor device. Thus, the performance of the device is degraded. However, in the present disclosure, semiconductor fins comprise a dummy pattern layer 206 disposed over the top layer of the semiconductor layer stack, thereby the top semiconductor layer (for example, semiconductor layer 204A comprises Si) is protected during the etching process to remove the dummy gate and the top channel damage/loss can be avoided. Therefore, with the protection of dummy pattern layer 206, all the channel semiconductor layers of the semiconductor device are of the uniform thickness to ensure the performance of the semiconductor device.

Referring to FIGS. 1 and 11A-11C, at operation 140, semiconductor layers 204B of fins 204, or portions thereof, are selectively removed to extend the trench 220 between semiconductor layers 204A and dummy pattern layer 206. As a result, semiconductor layers 204A and dummy pattern layer 206 are suspended in the channel region 204C of fins 204. Semiconductor layers 204A and dummy pattern layer 206 are slightly etched or not etched depending on the design requirements of device 200. In some embodiments, semiconductor layers 204A and dummy pattern layer 206 may be slightly etched to form various shapes of nanostructures (for example, nanowire, nanosheet, or other shapes of nanostructures). Since semiconductor layers 204B include a material having different etching selectivity than the material of semiconductor layers 204A and the dielectric material of dummy pattern layer 206, semiconductor layers 204B are removed by a selective etching process that is tuned to remove only semiconductor layers 204B while semiconductor layers 204A and dummy pattern layer 206 remain substantially unchanged. In some embodiments, the selective removal of semiconductor layers 204B may include an oxidation process (for example, to form semiconductor layers 204B comprising SiGeOx) followed by a selective oxidation removal (for example, SiGeOx removal). The selective etching may be a selective wet etching, a selective dry etching, or a combination thereof. In some embodiments, the selective wet etching process may include a hydro fluoride (HF) or NH4OH etchant.

Referring to FIGS. 1, 12A-12C to 15A-15C, at operation 145, metal gates 280A and 280B are formed in trench 220. Metal gates 280A, 280B are configured to include the same or different layers and/or materials, such that metal gates 280A, 280B can achieve desired functionality according to the design of device 200. In the depicted embodiment, metal gate 280A is formed in p-type region 202A and metal gate 280B is formed in n-type region 202B. A threshold voltage (Vt) of the p-type FET in p-type region 202A and a Vt of the n-type device in n-type region 202B are different, thus metal gate 280A is configured different than metal gate 280B. For example, a number, materials and/or thickness of layers of metal gate 280A may be different than a number, material, and/or thickness of layers of metal gate 280B. In furtherance of such embodiments, metal gates 280A and 280B can share one or more layers, such that some layers extend continuously from metal gate 280A to metal gate 280B. In some embodiments, one or more layers shared by metal gates 280A, 280B may be configured to achieve different characteristics.

First, referring to FIGS. 12A-12C, each of metal gate 280A and metal gate 280B includes gate dielectric layers 282 wrapped around each suspended semiconductor layer 204A and dummy pattern layer 206, barrier layers 284 disposed over gate dielectric layers 282, and first work function metal (WFM) layers 286 disposed over barrier layer 284. As illustrated in FIG. 12B, each of first WFM layers 286 wraps a barrier layer 284, further wraps a gate dielectric layer 282, and further wraps the suspended semiconductor layer 204A or dummy pattern layer 206. Some other layers/structures of metal gates 280A and 280B will be introduced in the following FIGS. 13A-13C to 15A-15C, such that different metal gate configurations may provide different work function and provide different threshold voltage (for example, different Vt for p-type FET in p-type region 202A and n-type FET in n-type region 202B). As depicted in FIGS. 12B and 12C, gate dielectric layers 282 are conformally deposited in trench 220 and wrap around the suspended semiconductor layers 204A and dummy pattern layer 206 of fins 204. In some embodiments, a thickness of dielectric layer 282 is about half nanometer to a few nanometers. In some embodiments, a thickness of gate dielectric layers 282 of metal gate 280A is substantially the same as a thickness of gate dielectric layers 282 of metal gate 280B. In some other embodiments, a thickness of gate dielectric layers 282 of metal gate 280A is different than a thickness of dielectric layers 282 of metal gate 280B. Gate dielectric layers 282 includes a dielectric material, such as silicon oxide, high-k dielectric material, other suitable dielectric material, or combinations thereof. In some embodiments, dielectric layers 282 include one or more high-k dielectric layers including, for example, hafnium, aluminum, zirconium, lanthanum, tantalum, titanium, yttrium, oxygen, nitrogen, other suitable constituent, or combinations thereof. In some embodiments, the one or more high-k dielectric layers include HfO2, HfSiO, HfSiON, HMO, HfTiO, HfZrO, ZrO2, Al2O3, HfO2-Al2O3, TiO2, Ta2O5, La2O3, Y2O3, other suitable high-k dielectric material, or combinations thereof. In some embodiments, the high-k dielectric material has a dielectric constant greater than or equal to about five (k≥5). In some embodiments, gate dielectric layers 282 further include an interfacial layer (including a dielectric material, such as silicon oxide) disposed between the high-k dielectric layers 208 and semiconductor layers 204A. In some embodiments, gate dielectric layers 282 include a nitrogen-doped oxygen-containing dielectric layer and a high-k dielectric layer disposed over the nitrogen-doped oxygen-containing dielectric layer. In some embodiments, gate dielectric layers 282 are configured to tune work functions of the p-type FET in p-type region 202A and the n-type FET in n-type region 202B according to the design requirements of device 200. Gate dielectric layers 282 are formed by various processes, such as ALD, CVD, PVD, other suitable process, or combinations thereof.

Subsequently, barrier layers 284 are conformally deposited over gate dielectric layers 282 in trench 220 and wraps around the suspended semiconductor layers 204A and dummy pattern layer 206 of fins 204. Barrier layers 284 can include a material that promotes adhesion between adjacent layers, and/or a material that blocks and/or reduces diffusion between adjacent gate layers, such as the gate dielectric layer and the work function layer. In some embodiments, barrier layers 284 include metal (for example, W, Al, Ta, Ti, Ni, Cu, Co, other suitable metal, or combinations thereof), metal oxides, metal nitrides (for example, TiN), or combinations thereof. In some embodiment, barrier layers 284 may include a work function metal material. Barrier layers 284 are formed by various deposition processes, such as ALD, CVD, PVD, other suitable process, or combinations thereof.

Thereafter, first WFM layers 286 are conformally deposited over barrier layers 284 and gate dielectric layers 282 in trench 220 and wraps around the suspended semiconductor layers 204A and dummy pattern layer 206 of fins 204. First WFM layers 286 can include a conductive material tuned to have a desired work function (such as an n-type work function or a p-type work function), such as n-type work function materials and/or p-type work function materials. P-type work function materials include TiN, TaN, Ru, Mo, Al, WN, ZrSi2, MoSi2, TaSi2, NiSi2, WN, other p-type work function material, or combinations thereof. N-type work function materials include Ti, Al, Ag, Mn, Zr, TiAl, TiAlC, TaC, TaCN, TaSiN, TaAl, TaAlC, TiAlN, other n-type work function material, or combinations thereof. First WFM layers 286 are formed by various deposition processes, such as ALD, CVD, PVD, other suitable process, or combinations thereof.

Referring to FIGS. 13A-13C, still at operation 145, first WFM layers 286 of one type of metal gate (for example, n-type metal gate 280B) is removed by a multi-Vt WFM patterning process. In the depicted embodiment, first WFM layers 286 of n-type metal gate 280B formed for n-type FET in the n-type region 202B is removed by a N/P patterning process. For example, the N/P patterning process may be performed to protect the p-type FET in the p-type regions 202A with a photoresist 1300. The photolithography process may include spin coating, soft-baking, exposure, post-baking, developing, rinsing, drying, and other suitable process. Alternatively, the N/P patterning may be performed by immersion lithography, electron beam lithography, or other suitable process. Thereafter, first WFM layers 286 of metal gate 280B formed for n-type FET in the n-type region 202B may be removed by a dry etching, a wet etching, or combinations of dry and wet etching process. Photoresist 1300 is then removed after the removal of first WFM layers 286 of metal gate 280B. First WFM layers 286 of metal gate 280A formed for p-type FET in the p-type region 202A remains.

Removal of the first WFM layers 286 of metal gate 280B (e.g., in a multi-Vt WFM patterning process) may also remove portions of or otherwise damage underlying layers (for example, portions of barrier layers 284 and/or gate dielectric layers 282) over dummy pattern layer 206 in the n-type region 202B. In some embodiments, as illustrated in FIG. 13B, portions of barrier layers 284 and gate dielectric layers 282 over dummy pattern layer 206 are removed, the remained portions of barrier layers 284 and gate dielectric layers 282 only wrap (contact) side surfaces and the bottom surface of the dummy pattern layer 206. In some other embodiments, portions of barrier layers 284 over dummy pattern layer 206 are removed, portions of gate dielectric layers 282 over dummy pattern layer 206 are remained. Thus, the top surface of dummy pattern layer 206 is covered by gate dielectric layer 282, and the side and bottom surfaces of dummy pattern layer 206 is wrapped (covered) by barrier layers 284 and gate dielectric layer 282. In yet some other embodiments, portions of barrier layers 284 and gate dielectric layers 282 over dummy pattern layer 206 are both remained (although the portion of barrier layers 284 over dummy pattern layer 206 may be slightly removed) after the WFM patterning process, thus dummy pattern layer 206 are wrapped around by both gate dielectric layer 282 and barrier layer 284.

Damaging the barrier layers and/or the gate dielectric layers is not detrimental to the fabrication process described herein as it would be in a conventional fabrication process. In a conventional fabrication process, the top layer of fin 204 is a top channel semiconductor layer (for example, top channel layer 204A comprises Si). The WFM patterning process in that case may cause top portion(s) of the gate dielectric layer and/or the barrier layer wrapped the top channel semiconductor layer to be damaged or lost. Thereby to affect the Vt uniformity of the semiconductor device. However, in the present disclosure, the top layer of fins 204 is dummy pattern layer 206. Top channel semiconductor layer 204A is protected by dummy pattern layer 206 during the WFM patterning process. Thus, even though the WFM patterning process may remove/damage gate dielectric layer 282 and barrier layer 284 over the top surface of dummy pattern layer 206, gate dielectric layer 282 and barrier layer 284 wrapped around the top channel semiconductor layer 204A are protected and remains unchanged (not damaged or lost). In addition, with the dummy pattern layer 206 formed over the top channel semiconductor layer 204A, the capacitance between the metal gate and the S/D contact (formed later) may be reduced.

Figure 14C:
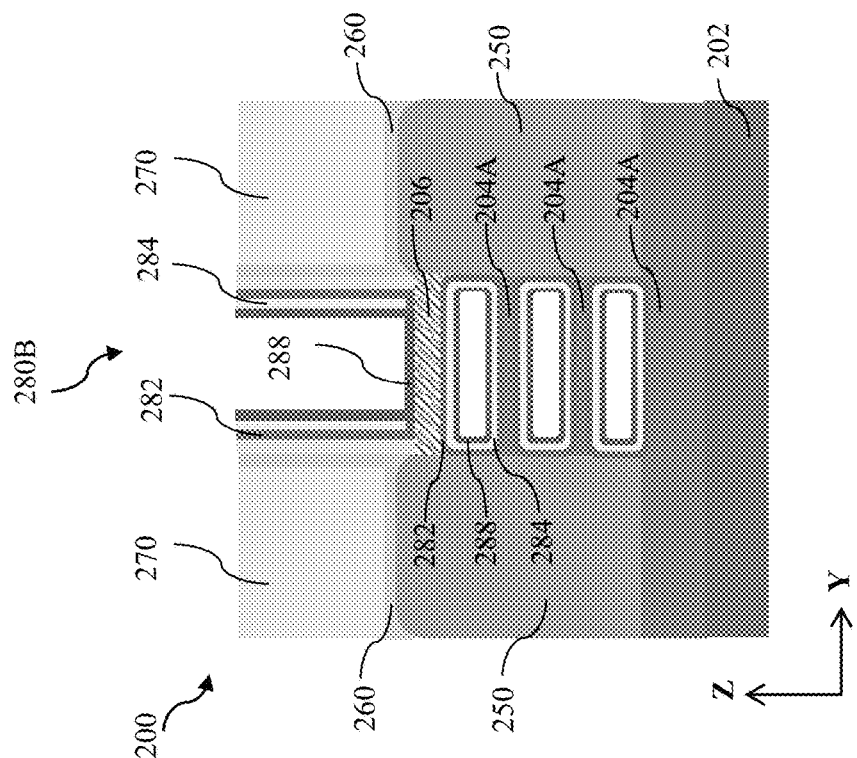
Figure 14A:
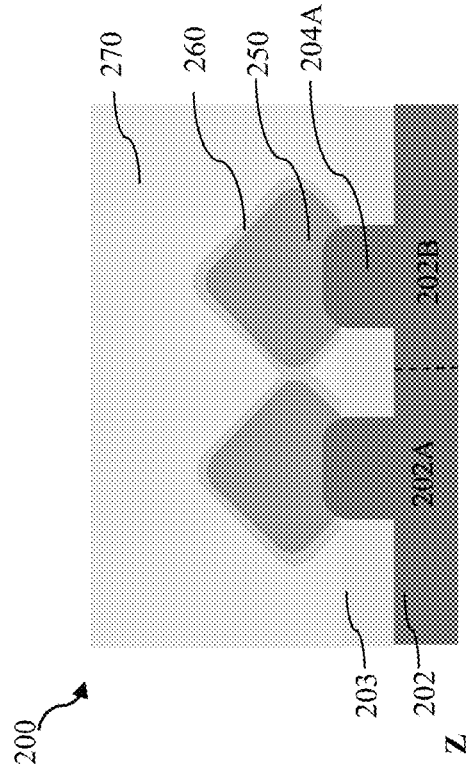
Figure 14B:
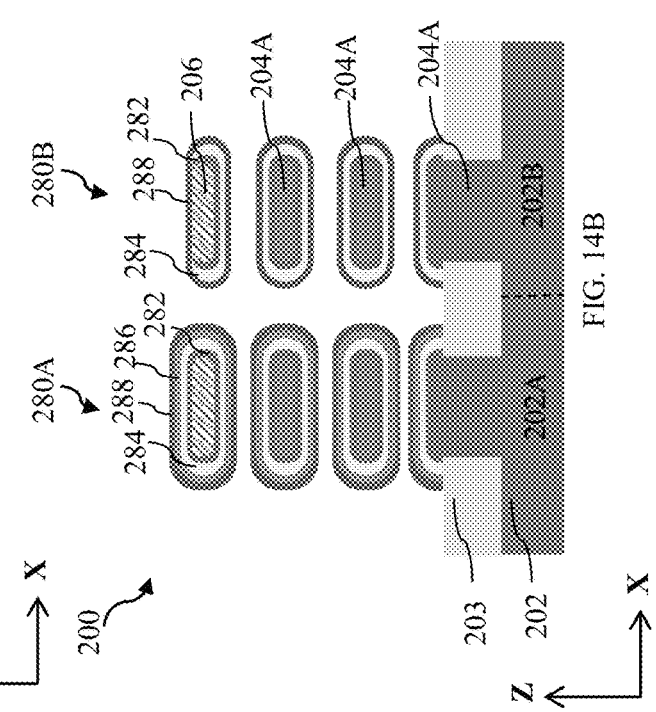

Now referring to FIGS. 14A-14C, second WFM layers 288 are conformally deposited over device 200, particularly over barrier layers 284 and gate dielectric layers 282 of metal gate 280B, and first WFM layers 286, barrier layers 284 and gate dielectric layers 282 of metal gate 280A. Second WFM layers 288 wrap around the suspended semiconductor layers 204A and dummy pattern layer 206 of fins 204. Second WFM layers 288 are not connect to each other, and various gaps are formed between second WFM layers 288 wrapped each semiconductor layer 204A and dummy pattern layer 206. Second WFM layers 288 may include a conductive material tuned to have a desired work function (such as an n-type work function or a p-type work function), such as n-type work function materials and/or p-type work function materials similar as first WFM layers 286. However, the work function material of second WFM layers 288 is different than the work function material of first WFM layers 286. Second WFM layers 288 are formed by various deposition processes, such as ALD, CVD, PVD, and/or other suitable process, such as those described herein.

Now referring to FIGS. 15A-15C, a metal fill layer 290 is formed over channel region 204C of fins 204 and fills in the gaps formed between the second WFM layers 288. Metal fill layer 290 can include a suitable conductive material, such as aluminum (Al), copper (Cu), tungsten (W), cobalt (Co), ruthenium (Ru), other suitable conductive materials, or combinations thereof. Metal fill layer 290 is formed by various deposition processes, such as ALD, CVD, PVD, and/or other suitable process, such as those described herein.

In a conventional fabrication process, without the protection of dummy pattern layer over the channel semiconductor layers, the layer configuration (for example, layer type including barrier layer, WFM layer, or other gate layers, layer number, layer material, layer thickness, and etc.) above the top channel semiconductor layer is different than the layer configuration between the adjacent channel semiconductor layers, which may result in non-uniformed Vt of the semiconductor device. However, as depicted in FIG. 15B, with the protection of dummy pattern layer 206, the layer configuration MG between adjacent channel semiconductor layer 204A, and the layer configuration MG between the top channel semiconductor layer 204A and dummy pattern layer 206 are the same. Therefore, the uniformity of Vt of the respective type of FET is improved. In addition, as discussed above, the capacitance between the metal gate and the S/D contact can be reduced.

Metal gates 280A and 280B may include other material layers, such as glue layers, hard mask layers, and/or capping layers. The various layers of metal gates 280A and 280B may be formed by any suitable method, such as CVD, ALD, PVD, plating, chemical oxidation, thermal oxidation, other suitable methods, or combinations thereof. A CMP process can be performed to remove any excess material of metal gates 280A and 280B, planarizing a top surface of device 200.

Now referring to FIGS. 1 and 16A-16C, at operation 150, method 100 performs further processing to complete the fabrication of device 200. For example, it may form various contacts/vias (such as S/D vias 296 and gate via 298), wires, and multilayer interconnect features (e.g., metal layers, other etch stop layers (for example 260'), other ILD layers (for example 270')) over substrate 202, configured to connect the various features to form a functional circuit that may include one or more multi-gate devices.

Although not intended to be limiting, one or more embodiments of the present disclosure provide many benefits to a semiconductor device and a formation process thereof. For example, the semiconductor device in the present disclosure comprises a dielectric dummy pattern layer over the semiconductor layers suspended in the channel region of the device. The dummy pattern layer can protect the top semiconductor layer from being damaged (thinner) during the dummy gate structure formation. The dummy pattern layer can also prevent gate dielectric layer, barrier layer, and other layers wrapped around the top channel layer from being removed/damaged during the multi-Vt WFM patterning process. In addition, with the dummy pattern layer, the capacitance between the metal gate and S/D contact can be reduced.

The present disclosure provides for many different embodiments. Semiconductor device having a dummy pattern layer disposed over a top semiconductor channel layer and methods of fabrication thereof are disclosed herein. An exemplary semiconductor device comprises a nanostructure disposed over a substrate, wherein the nanostructure includes a plurality of semiconductor layers separated vertically from each other and a dummy pattern layer including dielectric material disposed over and separated vertically from a top semiconductor layer of the plurality of semiconductor layers. The exemplary semiconductor device also includes a gate structure disposed over a channel region, wherein the gate structure wraps around each of the plurality of semiconductor layers and the dummy pattern layer of the nanostructure.

In some embodiments, the gate structure of the exemplary semiconductor device includes dielectric layers wrapped around each of the plurality of semiconductor layers and contacting at least a bottom surface of the dummy pattern layer of the nanostructure; first work function metal (WFM) layers wrapped around the dielectric layers, each of the plurality of semiconductor layers and the dummy pattern layer of the nanostructure; and a metal fill layer wrapped around the first WFM layers. The gate structure may further include second work function metal (WFM) layers disposed between the first WFM layers and the dielectric layers. In some embodiments, an entire surface of the dummy pattern layer is wrapped around by the dielectric layers. In some other embodiments, a top surface of the dummy pattern layer is not covered by the dielectric layers. Thicknesses of the dielectric layers, the WFM layers, and the metal fill layer between the dummy pattern layer and the top semiconductor layer are the same as thicknesses of the dielectric layers, the WFM layers, and the metal fill layer, respectively, between the top semiconductor layer and the next semiconductor layer below the top semiconductor layer of the plurality of semiconductor layers. In some embodiments, a thickness of the dummy pattern layer is about 30% to about 100% of a thickness of a top semiconductor layer of the plurality of semiconductor layers of the nanostructure.

Another exemplary semiconductor device comprises a first nanostructure disposed over a substrate in a first type device region, wherein the first nanostructure includes a first semiconductor layer and a first dielectric pattern layer disposed over and spaced apart vertically from the first semiconductor layer; and a second nanostructure disposed over the substrate in a second type device region, wherein the second nanostructure includes a second semiconductor layer and a second dielectric pattern layer disposed over and spaced apart vertically from the second semiconductor layer. This exemplary semiconductor device further comprise a gate structure disposed over channel regions of the first and the second nanostructures, wherein the gate structure wraps around the first semiconductor layer and the first dielectric pattern layer of the first nanostructure and the second semiconductor layer and the second dielectric pattern layer of the second nanostructure.

In some embodiments, a material of the first dielectric pattern layer and a material of the second dielectric pattern layer is selected from SiN, SiCN, SiOC, SiOCN, HfO, LaO, AlO, or a combination thereof. In some embodiments, the gate structure includes gate dielectric layers wrapped around the first semiconductor layer and the first dielectric pattern layer of the first nanostructure; first work function metal (WFM) layers wrapped around the gate dielectric layers; second WFM layers wrapped around the first WFM layers; and a metal fill layer wrapped around the second WFM layers. In some further embodiments, the gate dielectric layers also wrapped around the second semiconductor layer of the second nanostructure and contacting a bottom surface but not a top surface of the second dielectric pattern layer of the second nanostructure; the second WFM layers wrapped around the gate dielectric layers, the second semiconductor layer and the second dielectric pattern layer of the second nanostructure. In some embodiments, the gate structure further includes a gate spacer disposed along a sidewall of the gate dielectric layer, and a portion of the first dielectric pattern layer and a portion of the second dielectric pattern layer is below the gate spacer.

An exemplary method of forming a semiconductor device comprises forming a fin including a semiconductor layer stack and a dummy pattern layer over a substrate, wherein the semiconductor layer stack includes a first semiconductor layer and a second semiconductor layer including different semiconductor materials, and the dummy pattern layer includes a dielectric material and is disposed over a top layer of the semiconductor layer stack. The method further forms a dummy gate structure over a channel region of the fin and traversing source/drain regions of the fin, wherein the dummy gate structure wraps the fin including the dummy pattern layer and the semiconductor layer stack in the channel region; and replaces the dummy gate structure with a metal gate structure.

In some embodiments, replacing the dummy gate structure with the metal gate structure includes removing the dummy gate structure to expose the dummy pattern layer and the first and the second semiconductor layers in the channel region; selectively removing the second semiconductor layer such that the first semiconductor layer and the dummy pattern layer are suspended in the channel region; and depositing a metal gate stack to wrap around the suspended first semiconductor layer and the dummy patter lay. In some embodiments, removing the dummy gate structure also removes a top portion of the dummy pattern layer. In some embodiments depositing the metal gate stack includes depositing dielectric layers wrapped around the suspended first semiconductor layer and the dummy pattern layer; and depositing conductive metal layers over the dielectric layer, such that conductive metal layers wraps around the dielectric layer, the first semiconductor layer, and the dummy pattern layer. In some embodiments, depositing conductive metal layers includes depositing first work function metal (WFM) layers over the dielectric layers, such that the first WFM layers wrap around the dielectric layers. In some further embodiments, depositing conductive metal layers further includes depositing second WFM layers over the first WFM layers; and depositing a metal fill layer over the second WFM layers. In some other embodiments, depositing conductive metal layers further includes removing the first WFM layers; depositing second WFM layers over the dielectric layers; and depositing a metal fill layer over the second WFM layers. In some embodiments, removing the first WFM layers also removes a portion of the dielectric layer over the dummy pattern layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a nanostructure disposed over a substrate, wherein the nanostructure includes a plurality of semiconductor layers separated vertically from each other and a dummy pattern layer including dielectric material disposed over and separated vertically from a top semiconductor layer of the plurality of semiconductor layers; and
   a gate structure disposed over a channel region, wherein the gate structure wraps around each of the plurality of semiconductor layers and the dummy pattern layer of the nanostructure.

2. The semiconductor device of claim 1, wherein the gate structure includes:
   dielectric layers wrapped around each of the plurality of semiconductor layers and contacting at least a bottom surface of the dummy pattern layer of the nanostructure;
   first work function metal (WFM) layers wrapped around the dielectric layers, each of the plurality of semiconductor layers and the dummy pattern layer of the nanostructure; and
   a metal fill layer wrapped around the first WFM layers.

3. The semiconductor device of claim 2, wherein the gate structure further includes:
   second work function metal (WFM) layers disposed between the first WFM layers and the dielectric layers.

4. The semiconductor device of claim 2, wherein an entire surface of the dummy pattern layer is wrapped around by the dielectric layers.

5. The semiconductor device of claim 2, wherein a top surface of the dummy pattern layer is not covered by the dielectric layers.

6. The semiconductor device of claim 2, wherein thicknesses of the dielectric layers, the WFM layers, and the metal fill layer between the dummy pattern layer and the top semiconductor layer are the same as thicknesses of the dielectric layers, the WFM layers, and the metal fill layer, respectively, between the top semiconductor layer and the next semiconductor layer below the top semiconductor layer of the plurality of semiconductor layers.

7. The semiconductor device of claim 1, a thickness of the dummy pattern layer is about 30% to about 100% of a thickness of a top semiconductor layer of the plurality of semiconductor layers of the nanostructure.

8. A semiconductor device, comprising:
   a first nanostructure disposed over a substrate in a first type device region, wherein the first nanostructure includes a first semiconductor layer and a first dielectric pattern layer disposed over and spaced apart vertically from the first semiconductor layer, wherein the first dielectric pattern layer is disposed at a higher level within the first nanostructure than any semiconductor layer associated with the first nanostructure;
   a second nanostructure disposed over the substrate in a second type device region, wherein the second nanostructure includes a second semiconductor layer and a second dielectric pattern layer disposed over and spaced apart vertically from the second semiconductor layer; and
   a gate structure disposed over channel regions of the first and the second nanostructures, wherein the gate structure wraps around the first semiconductor layer and the first dielectric pattern layer of the first nanostructure and the second semiconductor layer and the second dielectric pattern layer of the second nanostructure.

9. The semiconductor device of claim 8, wherein a material of the first dielectric pattern layer and a material of the second dielectric pattern layer is selected from SiN, SiCN, SiOC, SiOCN, HfO, LaO, AlO, or a combination thereof.

10. The semiconductor device of claim 8, wherein the gate structure includes:

gate dielectric layers wrapped around the first semiconductor layer and the first dielectric pattern layer of the first nanostructure;

first work function metal (WFM) layers wrapped around the gate dielectric layers;

second WFM layers wrapped around the first WFM layers; and a metal fill layer wrapped around the second WFM layers.

11. The semiconductor device of claim 10, wherein:

the gate dielectric layers wrapped around the second semiconductor layer of the second nanostructure, and contacting a bottom surface but not a top surface of the second dielectric pattern layer of the second nanostructure;

the second WFM layers wrapped around the gate dielectric layers, the second semiconductor layer and the second dielectric pattern layer of the second nanostructure.

12. The semiconductor device of claim 10, wherein the gate structure further includes a gate spacer disposed along a sidewall of the gate dielectric layer, and a portion of the first dielectric pattern layer and a portion of the second dielectric pattern layer is below the gate spacer.

13. A device comprising:

a first stack of first semiconductor layers disposed on a substrate, wherein each of the first semiconductor layers are spaced apart from each other;

a second stack of second semiconductor layers disposed on the substrate, wherein each of the second semiconductor layers are spaced apart from each other;

a first dielectric pattern layer disposed directly over a topmost first semiconductor layer from the first stack of first semiconductor layers;

a first gate dielectric layer disposed directly on side and bottom surfaces of the first dielectric pattern layer; and a first gate electrode disposed directly on a top surface of the first dielectric pattern layer.

14. The device of claim 13, wherein the gate electrode includes a work function material layer.

15. The device of claim 13, wherein the gate dielectric layer includes an interfacial layer and a high-k dielectric layer.

16. The device of claim 13, further comprising:

a second dielectric pattern layer disposed directly over a topmost second semiconductor layer from the second stack of second semiconductor layers;

a second dielectric pattern layer disposed directly over a topmost second semiconductor layer from the second stack of second semiconductor layers;

a second gate dielectric layer disposed directly on side, bottom and top surfaces of the second dielectric pattern layer; and a second gate electrode disposed around the second gate dielectric layer such that the second gate electrode is prevented from interfacing with the second dielectric pattern layer by the second gate dielectric layer.

17. The device of claim 13, wherein the first gate dielectric layer interfaces with the top surface of the first dielectric pattern layer.

18. The device of claim 13, further comprising a dielectric sidewall spacer disposed along the first gate electrode such that the dielectric sidewall spacer interfaces with the first dielectric pattern layer.

19. The device of claim 13, wherein the first gate electrode extends between the topmost first semiconductor layer from the first stack of first semiconductor layers and another first semiconductor layer from the first stack of first semiconductor layers.

20. The device of claim 13, further comprising a source/drain feature disposed on the substrate and wherein the first dielectric pattern layer interfaces with source/drain feature.

* * * * *